United States Patent
Van Der Kouwe et al.

(10) Patent No.: US 7,358,732 B2
(45) Date of Patent: Apr. 15, 2008

(54) SYSTEM, METHOD, SOFTWARE ARRANGEMENT AND COMPUTER-ACCESSIBLE MEDIUM FOR PROVIDING REAL-TIME MOTION CORRECTION BY UTILIZING CLOVER LEAF NAVIGATORS

(75) Inventors: André J. W. Van Der Kouwe, Woburn, MA (US); Anders M. Dale, La Jolla, CA (US)

(73) Assignee: The General Hospital Corporation, Boston, MA (US)

( * ) Notice: Subject to any disclaimer, the term of this patent is extended or adjusted under 35 U.S.C. 154(b) by 143 days.

(21) Appl. No.: 11/257,925

(22) Filed: Oct. 24, 2005

(65) Prior Publication Data

US 2007/0090837 A1    Apr. 26, 2007

(51) Int. Cl.
 *G01V 3/00* (2006.01)
(52) U.S. Cl. ...................... 324/309; 324/318
(58) Field of Classification Search ........ 324/300–322; 600/407–445
See application file for complete search history.

(56) References Cited

U.S. PATENT DOCUMENTS

| | | | |
|---|---|---|---|
| 4,937,526 A | 6/1990 | Ehman et al. | |
| 5,539,312 A | 7/1996 | Fu et al. | |
| 6,118,273 A | 9/2000 | Takizawa et al. | |
| 6,307,369 B1 * | 10/2001 | Felmlee et al. | 324/309 |
| 6,541,970 B1 * | 4/2003 | Takizawa et al. | 324/309 |
| 6,771,068 B2 | 8/2004 | Dale et al. | |
| 6,894,494 B2 * | 5/2005 | Stergiopoulos et al. | 324/309 |
| 6,937,696 B1 * | 8/2005 | Mostafavi | 378/95 |
| 6,980,679 B2 * | 12/2005 | Jeung et al. | 382/128 |
| 7,239,136 B2 * | 7/2007 | Sussman et al. | 324/307 |

OTHER PUBLICATIONS

U.S. Appl. No. 10/846,372, filed May 14, 2004, Dale et al.

* cited by examiner

*Primary Examiner*—Brij Shrivastav
(74) *Attorney, Agent, or Firm*—Dorsey & Whitney LLP.

(57) ABSTRACT

A system, method, software arrangement and computer-accessible medium for correcting for a motion of an object are provided. In this system, method, software arrangement and computer-accessible medium, the navigator data and map data can be obtained for the object. Then, the navigator data is compared with the map to generate comparison data. Thereafter, a translation and/or a rotation of the object is corrected in real-time as a function of the comparison data. The navigator can be preferably a clover leaf navigator. In one exemplary embodiment, a scanning sequence can be used to determine a position of the object. For example, this scanning sequence may include a signal portion which includes at least one radio frequency signal, a navigator portion which includes at least one clover leaf navigator, and a spoiler portion provided for reducing a signal magnitude of the scanning sequence. The navigator is provided for allowing a measurement of the rotation and/or the translation of the object. The measurement can be adjusted by correcting for phase encoding effects, shimming errors, and B0 drifts. A feedback control system may be provided to repeatedly correct the measurement of the rotation and translation of the object. The navigator portion can advantageously be provided between the signal portion and the spoiler portion. The system, method, software arrangement and computer-accessible medium may be implemented when multiple coils are present.

51 Claims, 20 Drawing Sheets

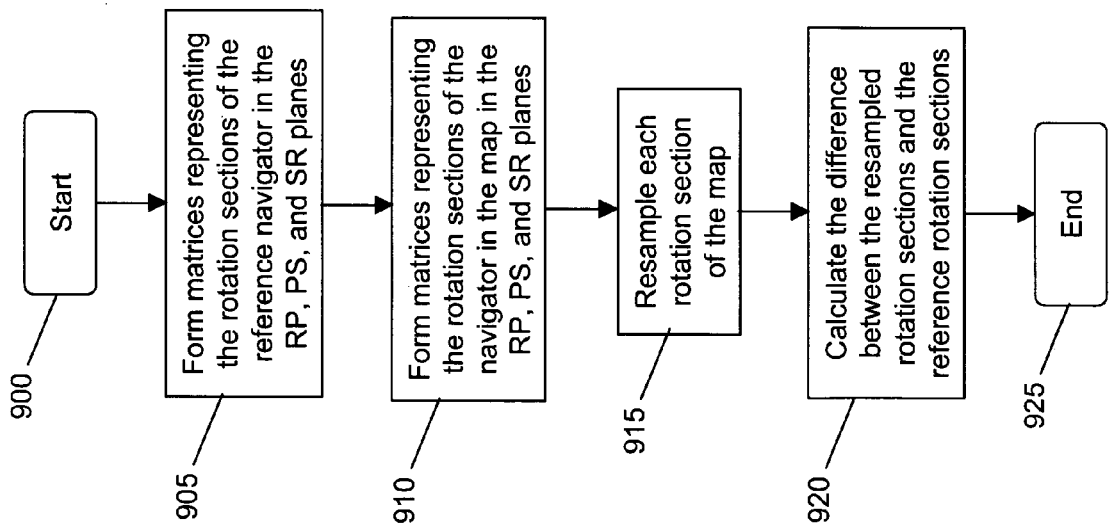

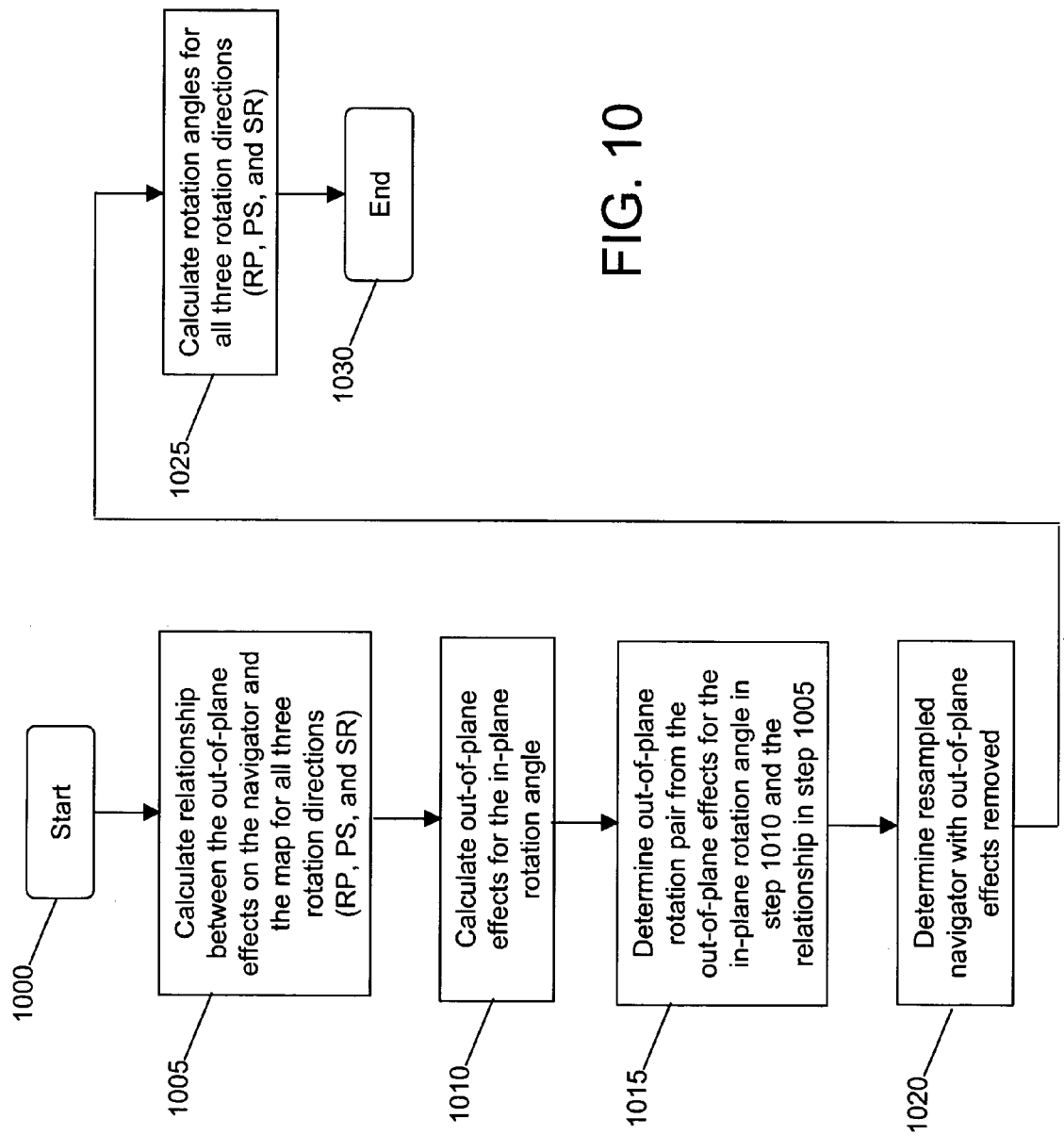

SYSTEM, METHOD, SOFTWARE ARRANGEMENT AND COMPUTER-ACCESSIBLE MEDIUM FOR PROVIDING REAL-TIME MOTION CORRECTION BY UTILIZING CLOVER LEAF NAVIGATORS

STATEMENT OF FEDERAL SUPPORT

This invention was made with Government support under grant numbers R21EB02530, R01EB1550, and P41RR14075 from the National Institute of Health. The Government may have certain rights to the invention described and claimed herein.

FIELD OF THE INVENTION

The present invention relates generally to system, methods, software arrangements and computer-accessible medium for tracking and correcting, in real-time, a motion of an anatomical object. In particular, the system, methods, software arrangements and computer-accessible medium of the present invention can employ clover leaf navigators to track and correct certain features of the anatomical object (e.g., a brain) during a three-dimensional scan thereof.

BACKGROUND INFORMATION

Magnetic Resonance Imaging ("MRI") has emerged as a leading medical imaging technology for the detection and assessment of many pathological and physiological alterations in living tissue, including many types of tumors, injuries, brain-related conditions, coronary conditions, and orthopedic conditions, among others. According to current medical knowledge, an MRI scan of a patient is non-invasive and harmless.

As know to those skilled in the art, the MRI scan generally utilizes magnetic and radio frequency ("RF") fields to elicit a response from a given patient's tissue, and to provide high quality image "slices," i.e., two-dimensional image reconstructions of a two-dimensional cross-section of the patient's body, e.g., a tissue along with detailed metabolic and anatomical information. The slices are formed from the transmission of radio waves, in combination with a magnetic field that is about 10,000-30,000 times stronger than the magnetic field of the earth, through the patient's body. This affects the patient's atoms by forcing the spins of the nuclei of some of the atoms into a different position. When such nuclear spins move back into place, they transmit their own radio waves. An MRI scanner receives those radio waves, and a computer associated with the MRI scanner transforms them into images, based on the location and strength of the incoming radio waves. A three-dimensional slab can be also be encoded by a combination of magnetic field gradients and RF pulses.

MRI scans offer high spatial resolution, superior anatomical detail of soft tissues as compared to other medical imaging technologies, and are able to acquire images in any plane. These scans, however, may be significantly affected by motion artifacts, such as the patient's respiration, cardiac cycle and physical movement. Such motion artifacts may cause problems in many MRI applications, including FMRI, cardiac and abdominal MRIs, and long repetition time ("TR") acquisitions, among others.

Motion artifacts may be reduced or compensated for with the use of several techniques, such as physiologic gating, phase-encode recording, fiducial markers, fast acquisitions, image volume registration, or other alternatives, including navigator-based techniques. The navigator-based techniques generally use k-space or image space navigators for detecting motion during image data acquisition. A navigator is a rapidly-acquired sequence of the anatomical object being scanned, e.g., the patient's head, representing a projection of the image data in k-space or image space and from which the position of the object may be deduced along with other information such as B0 drift, shim offsets and information related to physiological activity. A navigator signal may be produced in each pulse sequence along with the image signal. A data set may be acquired for both. The physiological motion causes global displacement in the navigator signal, and results in a shift of the navigator signal.

The data captured by the navigator can be used to detect rotational and translational motion in the plane and to correct for motion artifacts, either retrospectively or prospectively. A motion correction during the acquisition of a single volume should be performed prospectively as parts of k-space are omitted if motion occurs during an uncorrected scan.

The earliest navigator-based techniques for correcting motion artifacts have utilized straight-line navigator echoes to detect a linear motion. Such linear techniques may be useful in chest examinations where the diaphragm and associated organs translate along a particular axis. However, these conventional linear techniques do not quantify or determine the magnitudes or degrees of rotations of the objects being scanned, or portions thereof.

For example, U.S. Pat. No. 4,937,526 describes a similar conventional technique that uses a method for reducing motion artifacts in MRI images, in which the MRI data set used to reconstruct the image is corrected after its acquisition using information acquired concurrently by a navigator signal. This navigator signal described in the patent is a projection along an axis defined by the readout gradient which is fixed in direction throughout the scan. As a result, the navigator signal is only able to detect motion linearly, along the direction of the readout gradient, and is not able to provide rotational motion information, which is critical when performing certain MRI scans such as those of a patient's heart or brain.

The difficulty in correcting for a rotational motion has been ameliorated with the use of circular or orbital navigators. In one example, as described in U.S. Pat. No. 5,539,312, navigator signals are acquired using a unique pulse sequence which samples two-dimensional k-space in a circular trajectory. These circular navigator signals are used to correct image data for rotation and translation in a single two-dimensional plane. To obtain sufficient information to correct for all possible rotations and translations, three of these circular navigators are required to characterize the object motion about three cardinal axes. While this approach fulfills the theoretical need to compensate for all three axes of motions, it is relatively impractical because the entire procedure is time-consuming.

A preferred approach may be to use more sophisticated navigators to capture the translations and rotations of the object fully. For example, U.S. Pat. No. 6,771,068, the entire disclosure of which is incorporated herein by reference, describes that the navigator can be an octant navigator that traces the outline of an octant on the surface of a sphere in k-space. The octant navigator enables a rotation about the three cardinal axes and a translation in all three directions to be achieved in a single read after a single radio frequency pulse. A pre-mapping of the k-space in a small number of degrees in each direction from the initial octant navigator is generated to eliminate the need for an iterative, approximate solution. By comparing the actual navigator with a local pre-mapped k-space map, it is possible to determine the true rotations and translations using a single subsequent octant navigator. The octant navigator can be applicable in two- and three-dimensional sequences for motion correction.

In addition, U.S. patent application Ser. No. 10/846,372, the entire disclosure of which is incorporated herein by reference, describes a "clover leaf" navigator. The clover leaf navigator traces a path through k-space (or a phase space) that includes a straight-line section in each direction through the center of k-space to gauge translations, and may also include approximately ninety-degree arcs in three perpendicular planes to gauge rotations. These rotations can be described using quaternions to avoid the problem of "gimbal lock," which can occur when angle rotations that are described relative to the cardinal axes result in an alignment of two axes such that a degree of freedom is lost. The object's motion is then calculated using a rapid and robust linear method.

While the clover leaf navigator may provide better translation and rotational motion estimates than the octant navigator, such estimates do not remove out-of-plane effects from the navigator. The estimates may also be inaccurate if shifts in position of the object in the B0 field after shimming occur. Those shifts may invalidate the shim and result in offsets in the navigator trajectory in k-space and artifacts in the image. The navigator may also be affected by phase encoding gradients that change with every line of the image, and drift in the B0 field that occurs with heating of the shim iron during a high resolution scanning with large gradients or as a consequence of physiology such as breathing.

Thus, there is a need to provide a system, method, and computer-accessible medium for correcting motion artifacts during MRI scans in real-time by using the navigators that accurately estimate translations and rotations of the object being scanned. There is a further need to correct the motion artifacts during MRI scans in real-time by using the navigators that account for out-of-plane and phase encoding effects, shimming errors and B0 drifts. There is yet a further need to correct the motion artifacts during MRI scans in real-time by using the navigators when multiple coils are present.

SUMMARY OF THE INVENTION

In view of the foregoing, one of the objects of the present invention is to provide a system, method, software arrangement and computer-accessible medium for correcting the motion artifacts during MRI scans in real-time by using the navigators that accurately estimate translations and rotations of the object being scanned.

It is another object of the present invention to provide a system, method, software arrangement and computer-accessible medium for correcting the motion artifacts during MRI scans in real-time by using the navigators that account for out-of-plane and phase encoding effects, shimming errors and B0 drifts.

It is also reasonable to correct for shimming errors, B0 drifts or both during imaging using the navigators, but without the need to correct for motion using the navigators. The navigator path may be adapted to more efficiently capture only some subset of the information, e.g. for the case when only B0 drift, shim and translations are corrected, it may not be necessary to include the arcs in the navigator path.

It is yet another object of the present invention to provide a system, method, software arrangement and computer-accessible medium for correcting the motion artifacts during MRI scans in real-time by using the navigators when multiple coils are present.

These and other objects of the present invention can be accomplished using an exemplary embodiment of the system, method, software arrangement and computer-accessible medium of a clover leaf navigator that traces a path through k-space (or a phase space) with a straight-line section in each direction through the center of the k-space to gauge translations and with approximately ninety-degree arcs in three perpendicular planes to gauge the rotations. A sampling of the straight-line sections can be performed to ensure that there is a continuous traversal through the center of the k-space for each axis.

The rotations in the navigator can be represented with quaternions, since this exemplary representation is likely immune to the "gimbal lock" problem of Euler angles, which can occur when angle rotations (that are described relative to the cardinal axes) result in an alignment of two axes such that a degree of freedom is lost. Moreover, unlike matrices, quaternions most likely represent a rigid body rotation, and generally do not accumulate errors over successive multiplications. This can be important in feedback situations, where a series of small corrections is applied to the gradient rotation.

In one exemplary embodiment of the present invention, a pre-mapping of the k-space in a small number of degrees in each direction from the initial navigator can be generated to eliminate or reduce the need for an iterative, approximate solution. By comparing the actual navigator with a local pre-mapped k-space map, it is possible to determine the true rotations and translations using a single subsequent octant or clover leaf navigator. The navigator map can be collected by rotating through every combination of a table of angles and rotation axes. A navigator map may also be provided for PE/3D mapping and/or when multiple coils are present.

According to another exemplary embodiment of the present invention, the rotations may be estimated using a tightly constrained matching method that calculates the rotation angles by estimating and removing out-of-plane effects from the navigator, and by fitting translations of the corrected navigator magnitude along each of, e.g., three arc sections. This procedure can be constrained to physically possible motions, and generally does not overfit the acquired data.

In yet another exemplary embodiment of the present invention, the translations may be calculated in the frequency and/or space domain. For example, in the frequency domain, the translations may be calculated from the phase of the translation section of complex navigator samples through the center of k-space in the readout, phase encode, and/or slice directions, respectively. In the space domain, the translations may be calculated from the shift of the magnitude of the Fourier transform of the navigator samples through the center of k-space in the readout, phase encode, and/or slice directions, respectively. The translations can be proportional to the slope of the phase in each direction across the center of k-space and/or can be calculated by cross-correlating the FFT of the straight portion of the possibly translated navigator (relative to the average zero-rotation navigator) in the map.

In still another exemplary embodiment of the present invention, linear changes in the B0 field that may be due to shifts in the position of the object or changes in the shape of the object (e.g. due to breathing) after shimming can be estimated. These shifts can appear in the navigator as shifts in the center of k-space, and can be ascertained as shifts in the peaks measured during the three traversals through the center of k-space. For example, each shift can correspond to the projection of X, Y, and Z shim errors onto the corresponding imaging axis.

In yet another exemplary embodiment of the present invention, phase encoding effects can be accounted for in the navigator. These effects may be due to eddy currents, which are linear effects occurring mostly in the X and Y directions, and Maxwell errors, e.g., quadratic effect in the Z direction. The phase encoding effects can become significant at high resolutions and small fields of view when the phase encoding gradients become large. As described herein below, these effects may be modeled using a quadratic function (linear and quadratic terms) added to the navigator. The parameters for the model may be measured during a short mapping sequence.

In a further exemplary embodiment of the present invention, B0 drifts are also corrected for in the navigator. These drifts are caused by heating of the shim iron during high resolution scanning with large gradients and may also be caused by other factors such as loss of energy of the superconducting magnet through resistive components, changes in cooling system and physiological activity of the subject (e.g. breathing). The B0 drift correction may be conventionally performed by determining the frequency drift relative to the reference navigator and adding the opposite phase to the navigator and image samples. The corrections can also be made by altering the frequency of all the RF pulses in real time during scanning according to the estimated drift in the B0 field.

In yet a further exemplary embodiment of the present invention, motion correction may be performed when multiple coils are present. If a phase array is used, the navigator data may be combined before analysis if they are weighted by the ratio of the signal detected by the body coil which has a uniform B1 (RF field) profile to the signal detected by each element of the array. In each such case, the spins in the object are excited by RF energy transmitted by the body coil.

In still another embodiment of the present invention, a feedback control system may be used to repeatedly modify and/or correct the translations and/or rotations of the gradients so that they track and possibly predict the motion of an object. Exemplary control systems may be implemented with a direct proportional feedback and/or with a Kalman filter with linear feedback, e.g., an LQG controller.

Advantageously, because the motion artifacts are corrected accurately in accordance with the present invention, high resolution FLASH scans may be easily obtained from patients, even those that cannot remain still or motionless for an entire scan. The motion correction may significantly improve imaging in certain subject populations. Similar or same real-time prospective motion correction technique may be applied to several other sequence types such as multiecho FLASH and 3D EPI, and with suitable mapping procedures to account for shot-to-shot differences in the navigators also to 3D MPRAGE and 2D sequences such as 2D TSE. In certain sequences, the navigators may be incorporated with their own RF excitation pulses.

BRIEF DESCRIPTION OF THE DRAWINGS

The foregoing and other objects of the present invention will be apparent upon consideration of the following detailed description, taken in conjunction with the accompanying drawings, in which like reference characters refer to like parts throughout, and in which:

FIG. 9 shows a flow diagram of an exemplary embodiment of a method according to the present invention for determining out-of-plane effects on the navigator;

FIG. 10 shows a flow diagram of an exemplary embodiment of a method according to the present invention for determining rotation angles for the navigator with out-of-plane effects removed;

DETAILED DESCRIPTION OF EMBODIMENTS OF THE INVENTION

Generally, in accordance with exemplary embodiments of the present invention, a system and a method are provided for performing a real-time motion correction during MRI scans using clover leaf navigators. As stated herein, motion correction generally refers to the correction of motion artifacts present during an MRI scan of an object. These motion artifacts may be due to, for example, a patient's respiration, cardiac cycle and physical movement. A clover leaf navigator as used herein generally refers to a navigator having straight-line sections in each direction through the center of k-space to gauge translations and approximately ninety-degree arcs in three perpendicular planes to gauge rotations. As understood by one of ordinary skill in the art, the principles and embodiments of the present invention may be used to significantly improve the quality of MRI images acquired when motion artifacts are present.

Figure 1:
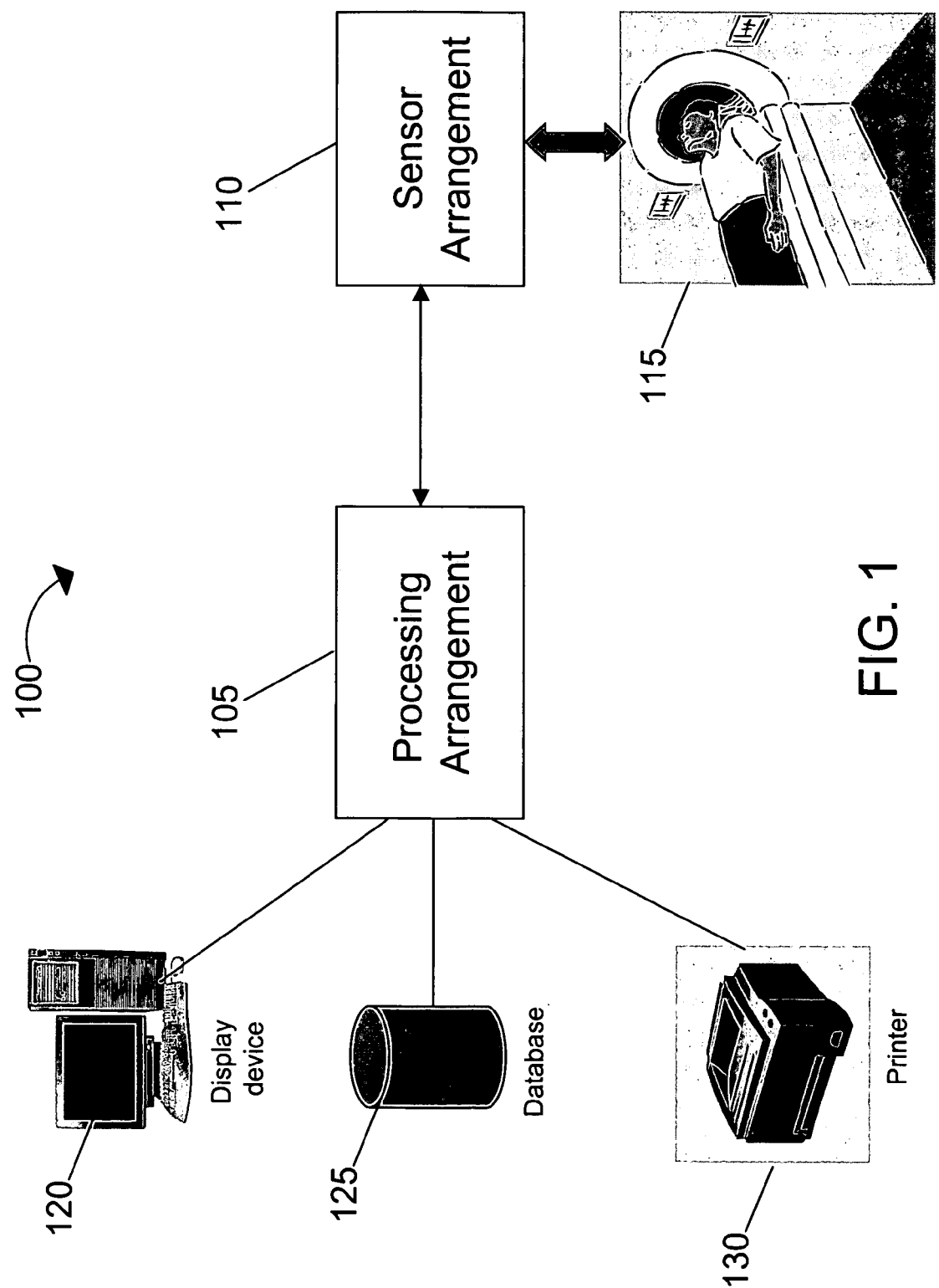
FIG. 1 shows a block diagram of an exemplary embodiment of a system according to the present invention which tracks and corrects a motion of an anatomical object in real time in accordance with the present invention.

A block diagram of an exemplary embodiment of a system 100 according to the present invention which tracks and possibly modifies/corrects a motion of an anatomical object in real time is illustrated in FIG. 1. As shown, the system 100 includes a processing arrangement 105 which is connected (either wirelessly or via a wired connection) to a sensor arrangement 110. The sensor arrangement 110 can be a conventional magnetic resonance ("MR") sensor arrangement with which a subject 115 can be scanned. The exemplary conventional sensor arrangement is described in U.S. Pat. No. 6,118,273, the entire disclosure of which is incorporated herein by reference.

For example, this conventional sensor arrangement generally includes a gradient magnetic field coil which is designed to generate a gradient magnetic field, a radio-frequency ("RF") coil which is designed to generate a high frequency magnetic field in the magnetic field region, and an RF probe which is designed to detect the MR signals generated from the subject 115. It is known to use gradient field coil arrangements in the gradient magnetic field coil which are provided in three axial directions, crossing perpendicular to one another.

The sensor arrangement 110 may also include a magnetic field source which can be actuated so that the coil arrangements may generate the gradient magnetic fields in response to the signals of the coil. With the gradient field coil arrangements, the magnetic fields in three axial directions (e.g., slicing, phase encoding and readout directions) can be applied to the space where the subject 115 is positioned. Using the sensor arrangement 110, the RF coil can generate a high frequency magnetic field in the form of a pulse to respond to the signals generated by an RF transmitter which is also an element of the sensor arrangement 110. An RF probe, which is provided substantially near the subject 115, generates the RF signals which are detected by signal detector of the sensor arrangement 110. Further details of the conventional sensor arrangement 110 are provided in U.S. Pat. No. 6,118,273.

These RF signals (and/or data equivalent therefor) may be received by the processing arrangement 105 which can be a general purpose computer (e.g., a Pentium®-based computer), a specific purpose computer, more than one computer or combination of computer(s) and special purpose hardware, specifically designed to receive and process the data corresponding to the RF signals. The processing arrangement 105 may be connected to a display device 120, a database 125, and a printer 130 for displaying, storing, and/or printing the data processed by the processing arrangement 105.

After the processing arrangement 100 receives the RF signals, it can determine if and to what extent at least a portion of the subject 115 that is being scanned has moved or rotated, e.g., by tracking the subject 115. If the processing arrangement 105 determines that at least a portion of the subject 115 has moved (e.g., the patient's head), the processing arrangement 105 can correct this motion in real time using the data it obtained regarding such movement. In accordance with an exemplary embodiment of the present invention, this data can include a clover leaf navigator, as described in further detail herein below.

For example, the navigator can be a scanning sequence which is usable for determining and acquiring positional data. The navigator measures a rotation of an object about the three cardinal axes, and the object's translation along each axis. The navigator may be the clover leaf navigator, which traces a path through k-space that includes a straight-line section in each direction through the center of k-space to gauge translations, and approximately ninety degree arcs in three perpendicular planes to gauge rotations.

Figure 2:
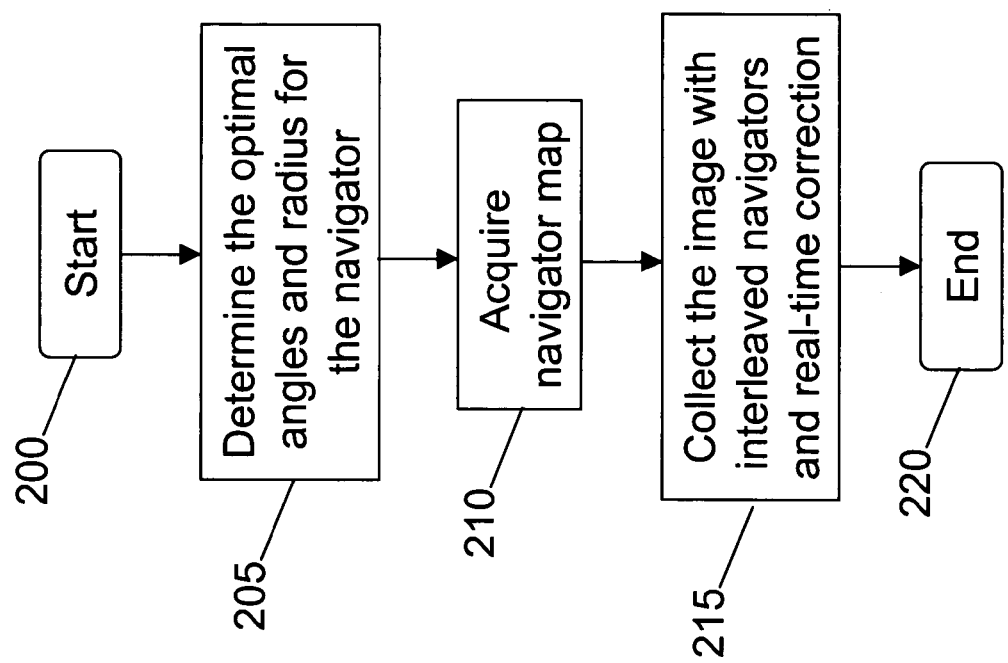
FIG. 2 shows a flow diagram of an exemplary embodiment of a method according to the present invention for tracking and correcting a motion of an anatomical object in real time.

Referring to FIG. 2, a top-level flow diagram of an exemplary embodiment of a method according to the present invention for tracking and correcting a motion of an anatomical object in real time using a clover leaf navigator is provided. This exemplary method may be implemented with the exemplary processing arrangement 105 illustrated in FIG. 1. As shown in FIG. 2, the optimal radius and optimal angles for the navigators may be determined in step 205. Then, in step 210, the map of the navigators can be obtained, e.g., prior to the scanning procedure. Further, the images with the interleaved navigators may be established and collected (step 215). In addition, the image can be preferably corrected using the map (obtained in step 210) and using the motion data corresponding to the motion and rotation of the object (which is generally determined using the clover leaf navigator).

The Clover Leaf Navigator

Figure 3:
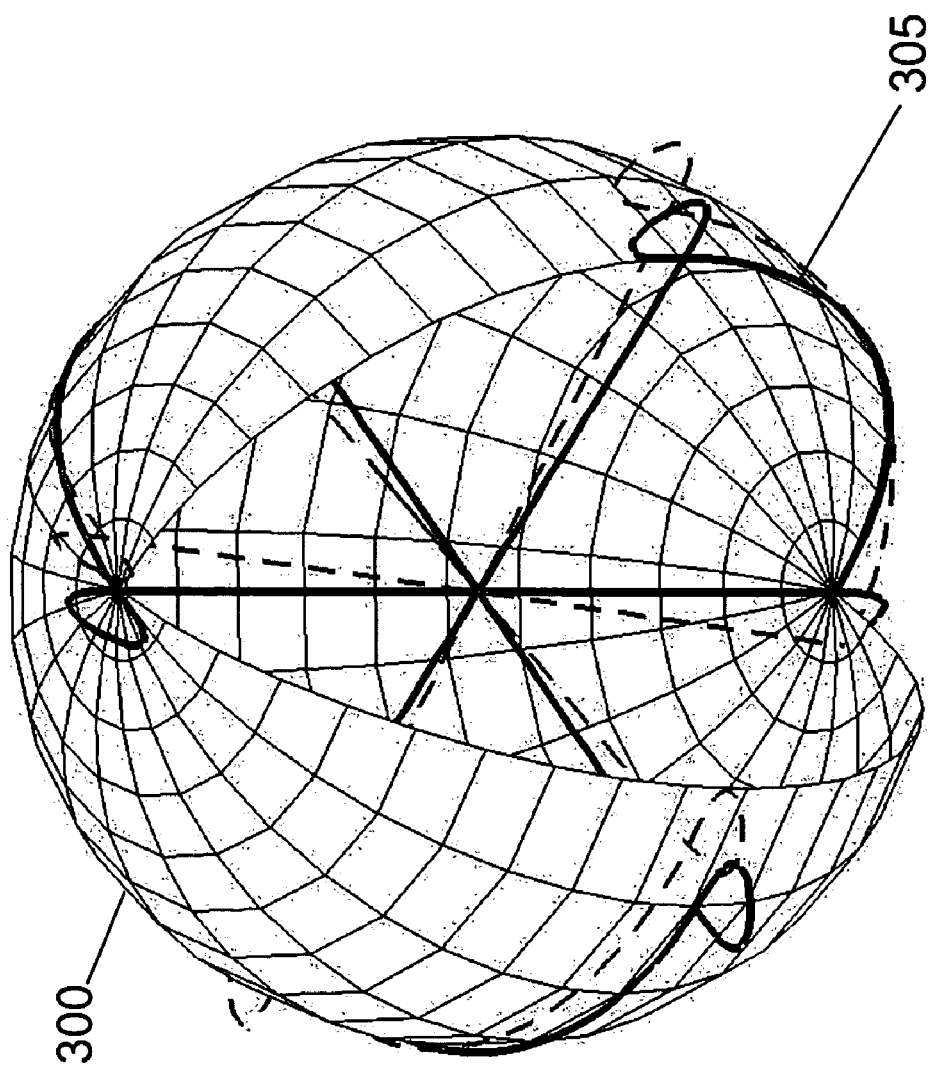
FIG. 3 shows an illustration of an exemplary navigator path in k-space that circumscribes a clover leaf section on a spherical surface of k-space and in three orthogonal directions through the center of k-space.

Referring to FIG. 3, an illustration of an exemplary navigator path in k-space that circumscribes a clover leaf section on a spherical surface of k-space is provided. As shown, a k-space sphere 300 corresponds to positional data of an object to be scanned and tracked for its motion. An exemplary path 305 of the clover leaf navigator can preferably pass through the center of the k-space sphere 300. The path 305 of the clover leaf navigator may preferably be formed of sinusoidal sections for arcs, constant gradient sections for traversals through the center of k-space and transition sections for the loops and smoothed ramps described by quartic splines. While the loops in the path 305 may appear to add unnecessary complications and possible loss of fidelity when the path 305 is actually executed on the gradients, a maximally smooth result is provided in the $2^{nd}$ and $3^{rd}$ derivatives, and the effects on the gradients are relatively minimal (e.g., gentle).

The exemplary clover leaf navigator can preferably be formed using the gradients of control signals generated by the sensor arrangement 110 (shown in FIG. 1) on the three axes. These gradients may be used in a k-space readout for tracing the path 305 for the clover leaf navigator. The navigator amplitude may be expressed in $mm^{-1}$, e.g., at a resolution at the radius of the arcs, to simplify the translation calculations. For example, an amplitude of around 0.125 $mm^{-1}$ may be used.

Figure 4:
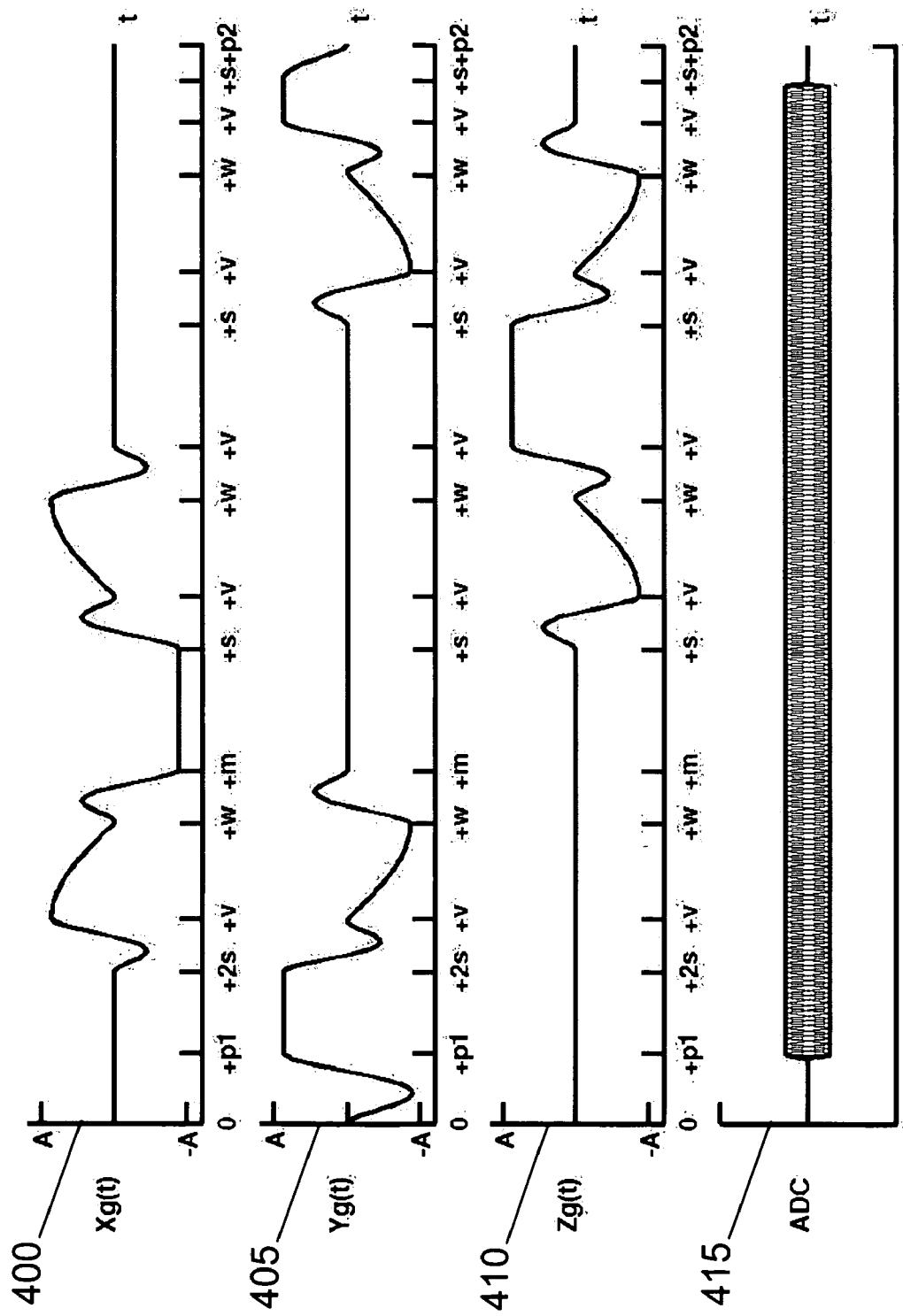
FIG. 4 shows a graph of an exemplary clover leaf navigator pulse sequence kernel according to the present invention.

FIG. 4 shows graphs of an exemplary embodiment of an exemplary clover leaf navigator pulse sequence kernel. The clover leaf navigator kernel can include three gradients, e.g., a phase gradient $Xg(t)$ 400, a readout gradient $Yg(t)$ 405, and a slice gradient $Zg(t)$ 410. The graphs of FIG. 4 also show that an analog-to-digital converter ("ADC") 415 can provide a readout signal, which occurs during a central portion of the gradient waveforms. During such time, the clover leaf navigator path 305 (FIG. 3) and the transitions at the navigator's corners may be traced out.

Figure 5:
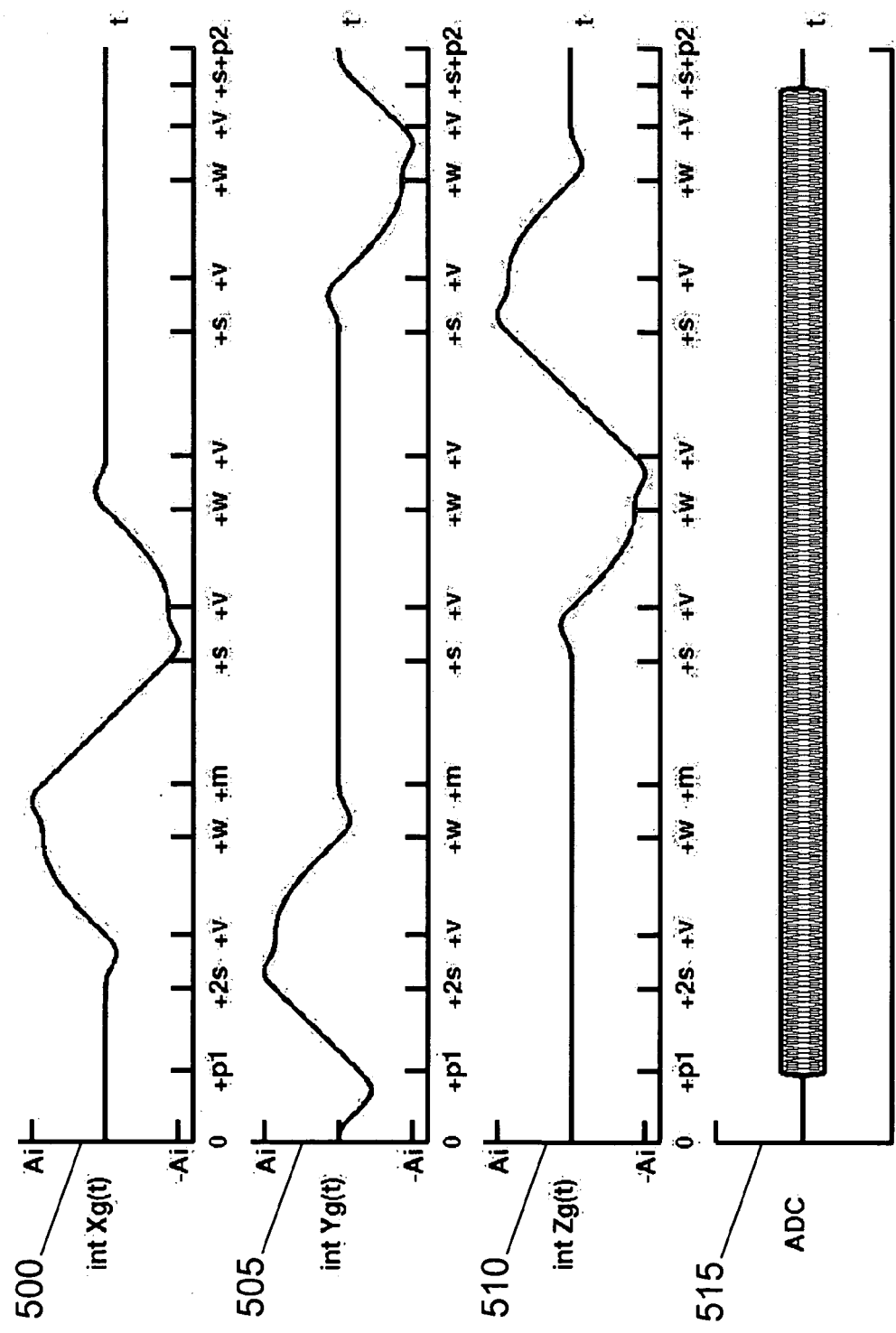
FIG. 5 shows a graph of exemplary gradient integrals that represent the position of the clover leaf navigator in k-space according to the present invention.

FIG. 5 shows graphs of exemplary gradient integrals int Xg(t) 500, int Yg(t) 505, and int Zg(t) 510, that represent the position of the clover leaf navigator in k-space, according to an exemplary embodiment of the present invention. The graphs 500-515 shown in FIG. 5 indicate that a sampling of the straight-line sections of the path of the clover leaf navigator may be asymmetrical in the first and last segments to ensure that there is preferably a continuous traversal through the center of k-space for each axis.

The clover leaf navigator kernel is generally not limited by either its SNR or its sample rate. For example, the maximum radius in k-space may be limited by the slew rate at the rounded corners. In another exemplary embodiment of the clover leaf navigator kernel according to the present invention, the kernel may exclude a full ninety degrees along each quarter circle of the sphere, and can round the edges inside the sphere. This can save time, and possibly improve the fidelity of the path that is actually followed in k-space after eddy current compensation is performed.

It is likely that any navigator shape that extends in all three directions, when used in combination of a preliminary map of navigator rotations, may suffice to provide rigid body motion estimates. However, as described in further detail herein below, the computation of the motion estimates can be simplified if the clover leaf navigator according to the present invention is utilized.

The clover leaf navigator may be implemented in sequences that encode k-space using either a two dimensional or three dimensional scheme. Since a sufficient structure in all three dimensions of a reasonably thick slab is preferred for a good motion estimate (e.g., including through-plane translations and out-of-plane rotations), the clover leaf navigator is preferably applied in a sequence with a naturally thick slab that is excited every TR, such as a three-dimensional FLASH sequence. In an exemplary three-dimensional FLASH sequence according to the present invention, the clover leaf navigator and imaging readout share the same RF excitation pulse.

Figure 6:
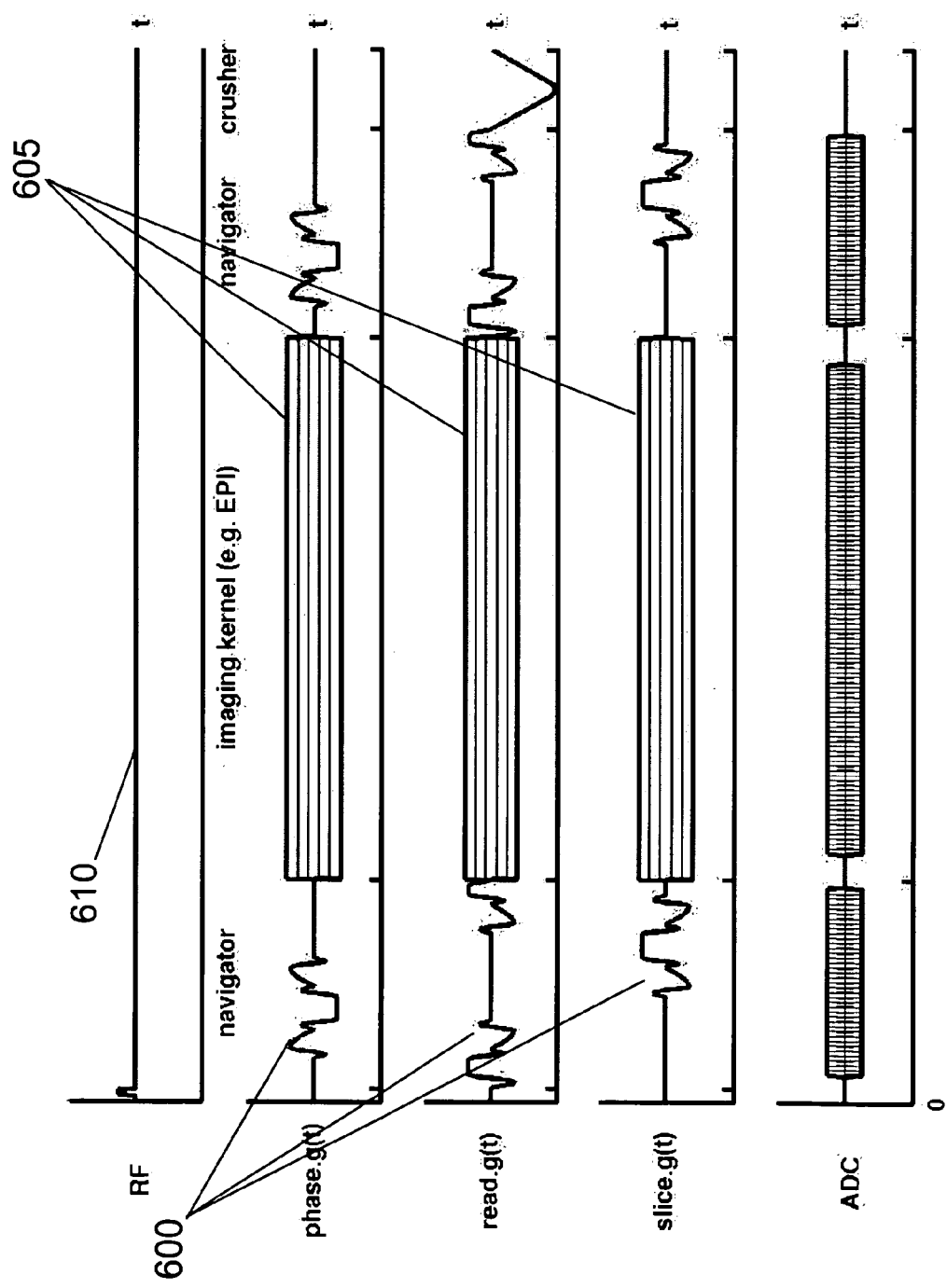
FIG. 6 shows a graph of an exemplary three dimensional clover leaf navigator implementation according to the present invention.

For example, in the three dimensional clover leaf navigator implementation, the example of which is depicted in graphs of FIG. 6, the clover leaf navigator 600 may be inserted before and/or after the imaging kernel readout 605, and can share the RF excitation pulse 610.

The pre-readout navigator may provide the most reliable motion estimates, but can have the disadvantage that it likely increases the minimum echo time for the image. The post-readout navigator is likely less reliable because there is less signal due to the longer echo time, and because it may be subtly altered by the changing phase encode gradients immediately preceding it. When the phase encoding gradients are large, e.g., during higher resolution imaging, they generally induce short-term eddy currents that may not easily compensated by the hardware and the quadratic Maxwell terms that are normally negligible, and can start to induce significant shifts in k-space in the z-direction. Shim estimation can be especially sensitive to these artifacts, as changes of less than 1 µT/m are detected. At modest resolutions of 1 mm isotropic, these effects can be ignored. Moreover, at higher resolutions, it may be preferable to remove or reduce these effects as explained in further detail herein below.

For the two dimensional implementation, the clover leaf navigator may be inserted in a block of its own with a low energy slab-selective excitation pulse, so that there is sufficient signal to estimate rotation about and translation along the axis perpendicular to the plane of the two dimensional slice.

Mapping Sequences

Simultaneous out-of-plane rotations can result in features entering or exiting the clover leaf navigator so that the in-plane rotation estimate is no longer accurate. To correct out-of-plane errors, a map of the features in k-space in the vicinity of the clover leaf navigator can be collected by rotating the gradients a few degrees about all three axes, and acquiring example navigators at each position. This mapping procedure can be completed in a relatively short time period (e.g., in a few seconds) before the main scan. It is preferable that the object being scanned remain motionless during the mapping. Reconstruction code executes on the scanner to provide immediate feedback in the form of a graph (e.g., stored as a DICOM overlay) and an overall figure of merit that reflects how much motion may have eventually occurred during the mapping.

In the clover leaf navigator, rotations can be described using quaternions, which may have certain advantages. First, using the quaternions may avoid the problem of gimbal lock, which can occur when angle rotations that are described relative to the cardinal axes result in an alignment of two axes such that a degree of freedom is lost. Additionally, the rotations may be further described using quaternion mathematics. Moreover, unlike matrices, the quaternions can represent a rigid body rotation without accumulating errors over successive multiplications. This may be important in feedback cases in which a series of small corrections can be applied to the gradient rotation.

Figure 7A:
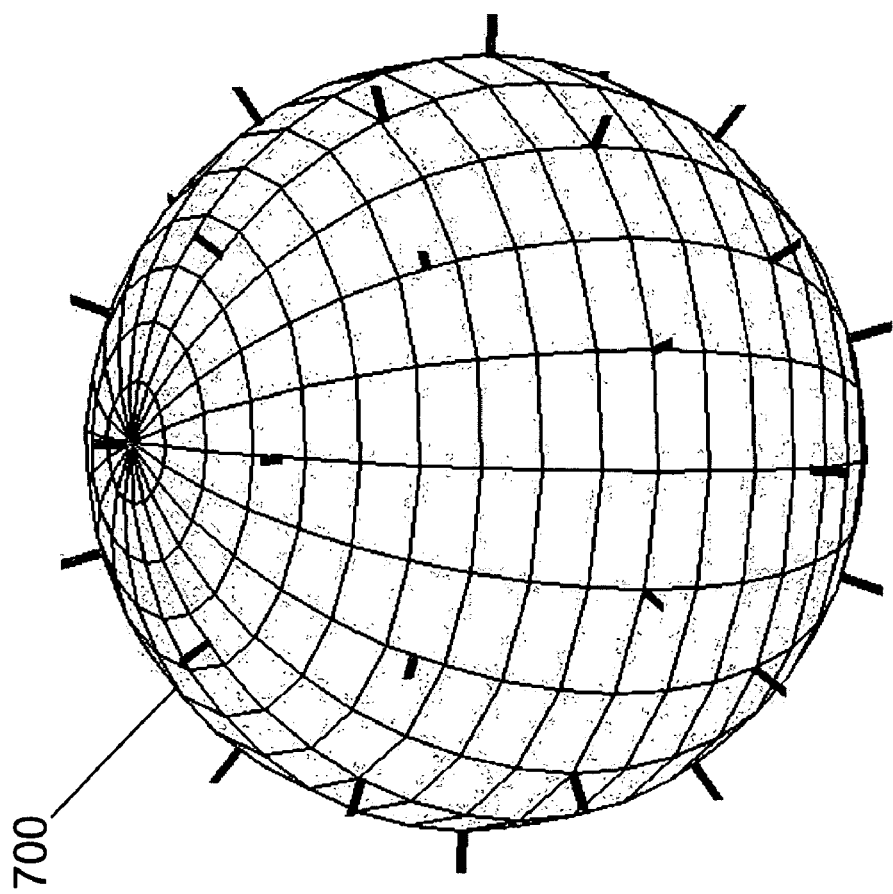
FIG. 7A shows an illustration of an exemplary clover leaf navigator map according to the present invention.

Quaternions can be easily obtained from axis-angle combinations. In an exemplary embodiment of a clover leaf navigator map 700 according to the present invention, which is depicted in FIG. 7A, a clover leaf navigator can be rotated through a number of combination of a table of angles, e.g., {−0.5°, −0.375°, −0.25°, −0.125°, 0°, 0.125°, 0.25°, 0.375°, 0.5°}, or some multiple of these angles and rotation axes. The rotation axes may be, for example, the vectors representing the equally spaced points on a supertessellated icosahedron with 42 vertices (one tessellation up from the 12-vertex icosahedron) as shown in FIG. 7A. This exemplary embodiment provides 378 navigators in the map 700. Repeated maps can be collected and compared to one another to eliminate motion during the mapping procedure. For example, the map 700 may be collected in just over 10 seconds in an exemplary FLASH implementation according to the present invention.

Figure 7B:
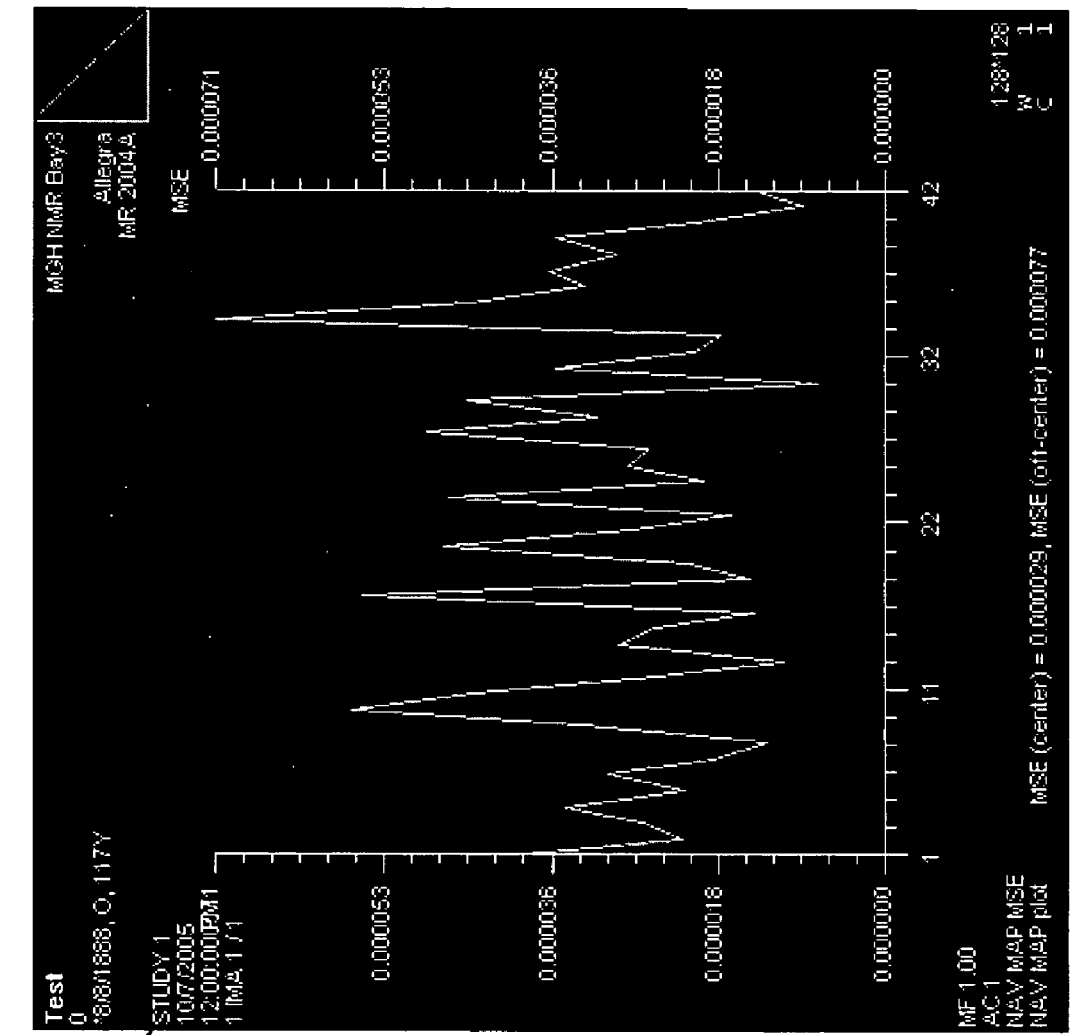
FIG. 7B shows a graph of an exemplary error that was detected during an acquisition of a map in accordance with an exemplary embodiment of the present invention, and illustrates a motion of a subject during the map.

A small range of angles can be sufficient for the map 700, since at every TR, the correction returns the sampled navigator to the center of the map, so that the angular range of the map only needs to exceed the expected error at every TR. The null-rotated navigator may be sampled redundantly throughout the map. These are averaged to calculate a reliable reference navigator for translation estimation. The errors between null-rotated navigators may be used to gauge motion during the map and generate a motion graph as shown in FIG. 7B. In particular, FIG. 7B shows a plot 710 of an exemplary error detected during the acquisition of the map in accordance with the present invention, and also illustrates a subject motion during the map. As shown in this plot, the exemplary subject motion was minimal.

Exemplary Mapping Procedure for Mapping

For example, let $M_{nav|PE}$ be a matrix of the navigators collected during a short mapping sequence with a range of phase encoding moments listed in the vectors $a_{PE}$ and $a_{3D}$ that are a subset of the phase encoding ("PE") in the imaging sequence including the extreme values in both phase encoding directions (PE and 3D directions) for a 3D sequence (as shall be described herein below). This exemplary map can be acquired by executing a series of FLASH kernels (e.g., RF excitation, PE and 3D encoding gradients and readout prewinder gradients, readout gradient, rewinder and spoiler gradients) as in a conventional FLASH sequence, but with the PE and 3D gradients stepping independently through all the steps that will be used in the imaging sequence for which the map is being collected i.e. first the PE steps with the 3D gradient set to zero, then the 3D steps with the PE gradient set to zero. This limits the total duration of the mapping sequence. The phase encoding steps could also be collected in combination to capture any cross-terms and these would automatically be accounted for in the matrix representation described in further detail below provided that, e.g., $a_{PE}$ and $a_{3D}$ are assigned appropriately to describe the gradients used during mapping. For other sequence types, the appropriate phase encoding and sequence kernel is used.

It is also possible to utilize an exemplary embodiment of a mapping procedure according to the present invention for the case of multiple coil elements. For example, let $N_i^{ref|PA}$, i=1 . . . M be reference navigators collected using each of the M elements of the array. Let $N^{ref|BC}$ be the reference navigator collected using the body coil (as described in herein below). These navigators are collected using a map acquired by running a series of FLASH kernels as in a conventional FLASH sequence, e.g., once with the body coil (or some other uniform transmit coil) transmitting and body coil receiving, and once with the body coil transmitting and elements of the array coil receiving. The unrotated reference navigator is acquired repeatedly during the map until a steady-state and sufficiently averaged reference can be obtained (in principle, once steady-state is achieved, only a single navigator is needed). For other sequence types, the appropriate sequence kernel can be used. Rotated navigators may be collected in the map although rotating the gradients and rotating the actual physical object is not exactly equivalent due to the spatially nonuniform B1 receive profiles of the array elements and spatially nonuniform B0 and gradient field. For accurate motion correction, these effects should be mapped and/or modeled. If the RF coil cannot detune when the body coil transmits, the signal from the various coil elements can be averaged or combined as sum of squares, instead of weighting by the ratio of the body coil and array maps.

The rotation map, the phase encoding map and B1 profile (e.g., multiple coil element) maps can be combined into a single map (acquired with body coil and with array) and/or prepended to the FLASH or other sequence to avoid the need to run a separate mapping sequence. The map can be repeated automatically until it is determined that there was no motion during the map. The amount of motion can be estimated from the mean square difference between repeated unrotated reference navigators collected during the map.

Rotations

As a consequence of the shifting property of the Fourier transform, translations in real space generally correspond to phase shifts in k-space:

$$f(x+\Delta x, y+\Delta y, z+\Delta z) \leftrightarrow F(k,l,m)e^{-i2\pi(k\Delta x+l\Delta y+m\Delta z)} \quad (1)$$

Moreover, the rotations in real space correspond to the rotations in k-space.

The rotations can be estimated from the navigator magnitude information. Once rotations have been corrected, the translations in real space can be estimated from the navigator phase information, and corrected by adjusting the phase of the image k-space data.

In accordance with exemplary embodiments of the present invention, certain methods for estimating the rotations may be used. One exemplary method, described in further detail in commonly-owned U.S. patent application Ser. No. 10/846,372, the entire disclosure of which is incorporated herein by reference, can be used to estimate the rotations using a rapid and robust linear technique. The linear technique can yield noisier estimates than nonlinear methods, and is likely less computationally intensive and generally degrades gracefully in the presence of noise.

Figure 8A:
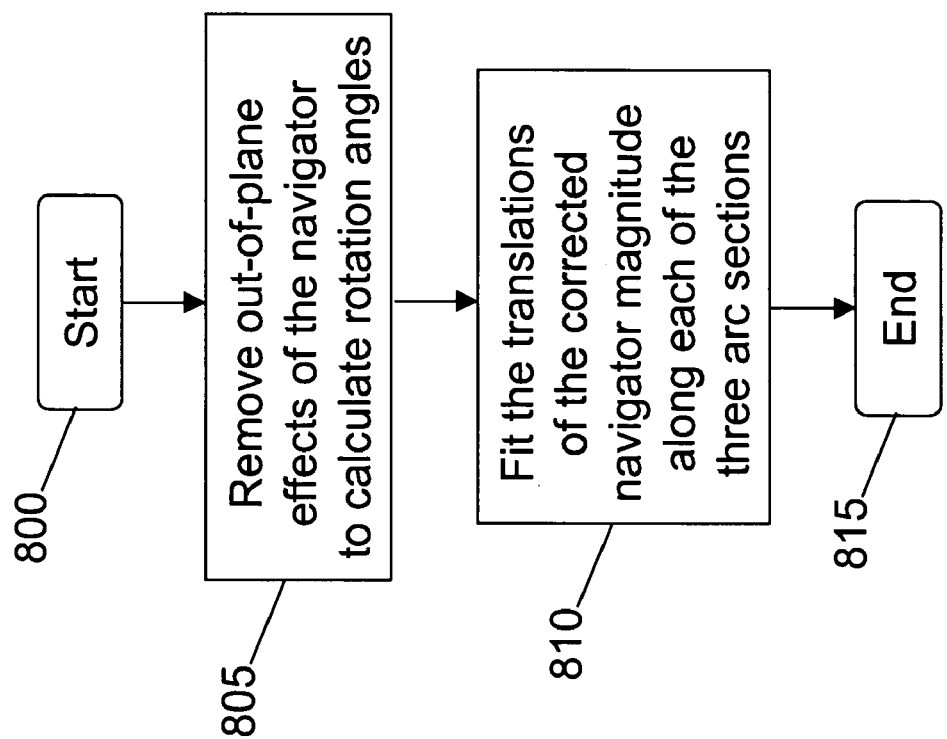
FIG. 8A shows a flow diagram of exemplary embodiment of a method according to the present invention for determining rotations for the clover leaf navigator.

In a flow diagram of another exemplary embodiment according to the present invention, illustrated in FIG. 8A, rotations may be estimated using a more tightly constrained and more accurate matching method. In this matching method, rotation angles can be calculated by estimating and removing out-of-plane effects from the navigator (step 805), and fitting the translations of the corrected navigator magnitude along each of the three arc sections (step 810). This method is constrained to physically possible motions and does not overfit the data.

Figure 8B:
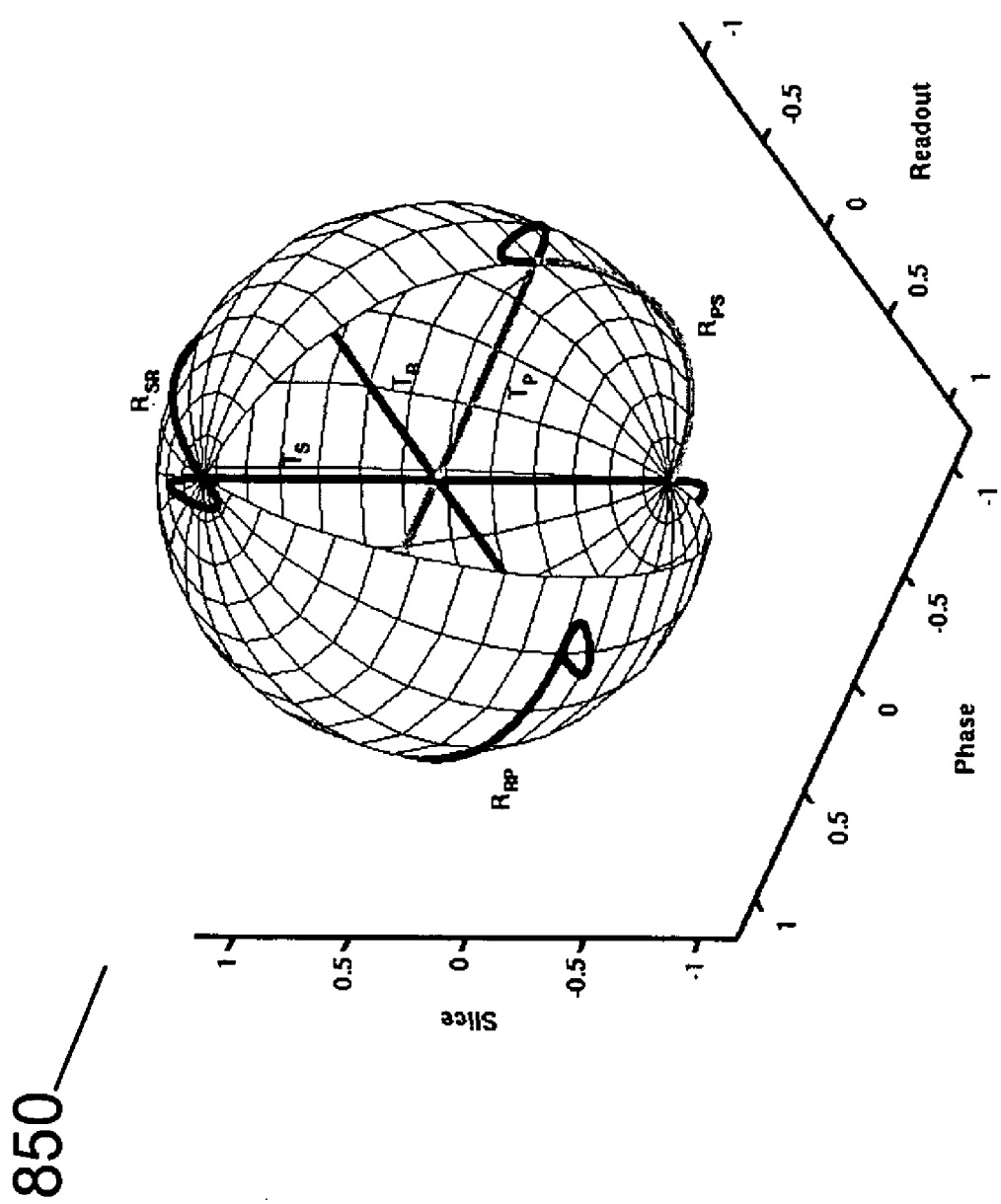
FIG. 8B shows a graph of subregions of navigator samples according to an exemplary embodiment of the present invention.

As shown in FIG. 8B which shows a graph of an exemplary navigator 850, subregions of the navigator samples can be defined. In particular, vectors $R_{RP}^{abs}$, $R_{PS}^{abs}$ and $R_{SR}^{abs}$ can be vectors containing the magnitudes of the samples along the arc (rotation sections) of the navigator in the RP, PS and SR planes, respectively, where R refers to readout, P refers to phase encoding, and S refers to slice.

FIG. 9 shows a flow diagram of an exemplary embodiment of a method according to the present invention for calculating out-of-plane effects on the navigator. $M_{RP}^{ref|abs}$, $M_{PS}^{ref|abs}$ and $M_{SR}^{ref|abs}$ can represent the rotation sections of the reference navigator, e.g., the average un-rotated navigator from the map (step 905). $\Gamma$ represents the matrix (order: 3×N) of elemental angle rotations through which the navigators in the map were rotated (for a map of N navigators). $M_{RP}^{map|abs}$, $M_{PS}^{map|abs}$ and $M_{SR}^{map|abs}$ represents the matrices of navigator rotation sections in the map (step 910). Using such definitions, a vector operation resample $$\left( \underset{x}{res} N \right)$$

may then be defined as the result of shifting and resampling (with linear interpolation) the values in the vector by x samples as follows:

$$\left( \underset{x}{res} N \right)_i = aN_{i-floor(x)-1} + bN_{i-floor(x)} \quad (2)$$

where b=x−floor(x) and a=1−b.

Each rotation section (RP, PS and SR) of the map can be resampled (step 915) by the negative of the rotation angle at which it was acquired (in the same plane), e.g.:

$$M_{RP}^{res|abs} = \underset{-\Gamma_{RP}}{res} M_{RP}^{map|abs} \quad (3)$$

Then, in step 920 the out-of-plane effects may be given by:

$$M_{RP}^{diff|abs} = M_{RP}^{res|abs} - M_{RP}^{ref|abs} \quad (4)$$

Referring to FIG. 10, a flow diagram of an exemplary embodiment of a method according to the present invention for calculating rotation angles for the navigator with out-of-plane effects removed is provided.

$A_{RP}$ can be a part of the map angle matrix $\Gamma$ listing the out-of-plane angles PS and SR (order 2×N). Then, in 1005 the relationship between the out-of-plane effects on the navigator and the map may be given by:

$$B_{RP}^{inv} = (A_{RP}^+ M_{RP}^{diff|abs})^+ \quad (5)$$

and this relationship may be pre-calculated for all three rotation directions after the map has been acquired.

For every new vector of navigator samples N acquired during the imaging sequence, $R_{RP}^{N|abs}$, $R_{PS}^{N|abs}$ and $R_{SR}^{N|abs}$ can represent the magnitude of the samples in the rotation sections.

In step 1010, out-of-plane effects for the in-plane rotation may be estimated as follows:

$$\hat{\theta}_{RP} = \min_{\theta_{RP}} \left[ \left| \hat{R}_{RP,\theta_{RP}}^{res|abs} - R_{RP}^{ref|abs} \right|^2 / \left| R_{RP}^{ref|abs} \right|^2 \right] \quad (9)$$

In step 1015, the estimated out-of-plane rotation pair $\hat{\alpha}_{\overline{RP}=[\alpha_{PS}} \alpha_{SR}]$ may then be given by:

$$\hat{\alpha}_{\overline{RP},\theta_{RP}} = B_{RP}^{inv} R_{RP,\theta_{RP}}^{diff|abs} \quad (7)$$

In step 1020, the estimated resampled navigator with out-of-plane effects removed may therefore be given by:

$$\hat{R}_{RP,\theta_{RP}}^{res|abs} = R_{RP}^{ref|abs} + B_{RP} \hat{\alpha}_{\overline{RP},\theta_{RP}} \quad (8)$$

In step 1025, the rotation angle $\hat{\theta}_{RP}$ in the RP plane may then be estimated as follows:

$$R_{RP,\theta_{RP}}^{diff|abs} = \underset{\theta_{RP}}{res} R_{RP}^{N|abs} - R_{RP}^{ref|abs} \quad (6)$$

The other two angles $\hat{\theta}_{PS}$ and $\hat{\theta}_{SR}$ may be calculated similarly.

Translations

Using the clover leaf navigators, translations may be calculated in the frequency or in the space domain. Translations in the readout and phase encode directions are preferably calculated in the frequency domain and translations in the slice directions are preferably calculated in the space domain.

Figure 11:
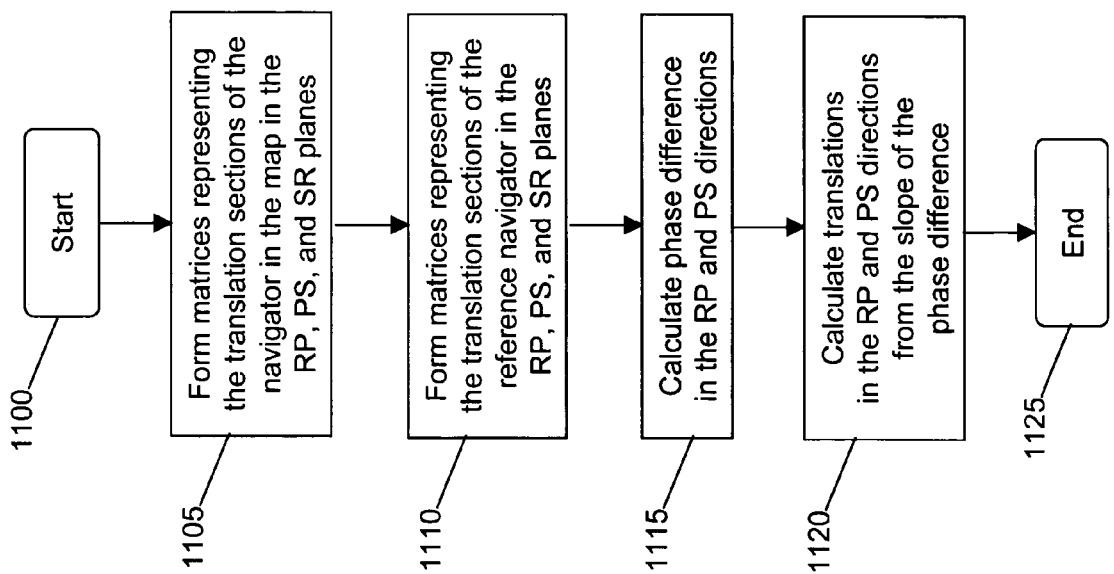
FIG. 11 shows a flow diagram of an exemplary embodiment of a method according to the present invention for determining translations in the readout and phase encode directions.

Referring to FIG. 11, a flow diagram of, an exemplary embodiment of a method according to the present invention for calculating translations in the readout and phase encode directions is provided. For example, in the frequency domain, translations may be easily calculated from the phase of the translation sections of the complex navigator samples ($T_R$, $T_P$ and $T_S$) through the center of k-space in the readout, phase encode and slice directions, respectively (step 1105). $T_R^{ref}$, $T_P^{ref}$ and $T_S^{ref}$ represent the translation sections of the reference navigator (step 1110). Then, in step 1115, the phase difference in the readout direction may be given by:

$$T_R^{\Delta\phi} = \phi(T_R/T_R^{ref}) \quad (10)$$

Using the least squares fit to the specified elements of a vector as the slope operation, the translation in the readout direction may be given by (step 1120):

$$\hat{t}_R = \underset{-\Delta K < k < \Delta K}{slope} T_R^{\Delta\phi} \quad (11)$$

where the interval $-\Delta K < k < \Delta K$ spans the samples acquired around the center of k-space. The translation in the phase encode direction may be calculated as the translation in the readout direction described above.

In the slice direction, this approach may be confounded by the slab selection. For example, the phase slope may be dominated by the position of the slab as selected by the RF pulse and not by the actual position of the object. In this case, the translation in the slice direction may be estimated using a space domain approach.

Figure 12:
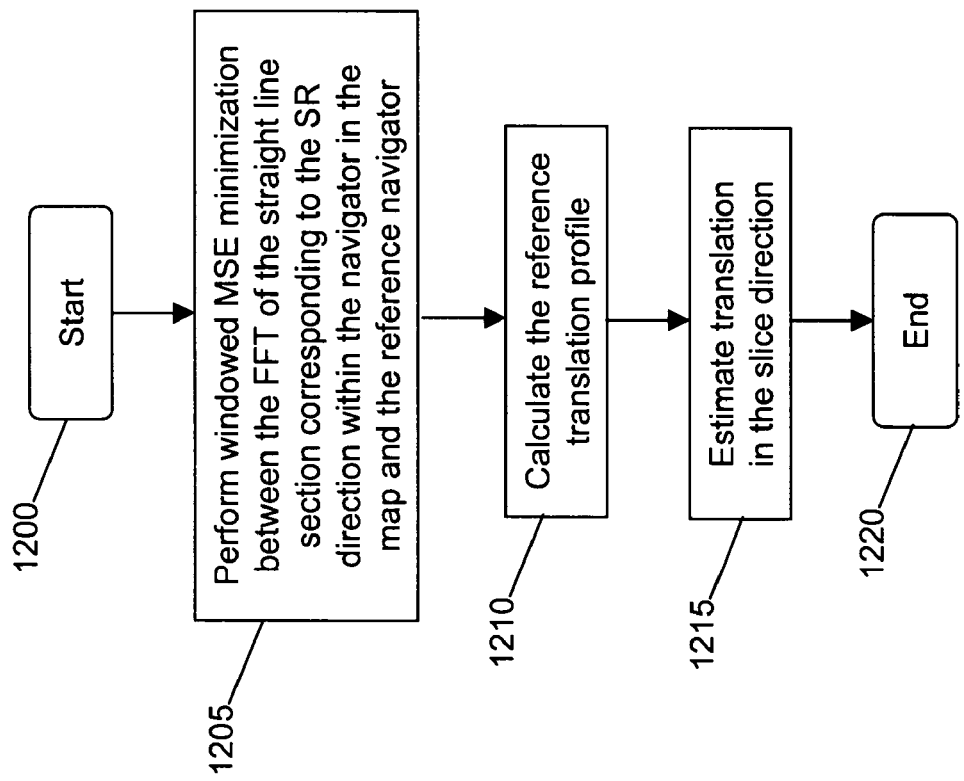
FIG. 12 shows a flow diagram of an exemplary embodiment of a method according to the present invention for determining translations in the slice direction.

Referring to FIG. 12, a flow diagram of an exemplary embodiment of a method according to the present invention for calculating translations in the slice direction is provided. For example, the translation in the slice direction may be estimated by a windowed MSE minimization between the FFT of the straight line section corresponding to the slice direction within the new navigator and reference navigators that avoids the edges of the slab (step 1205).

For example:

$$T_S^{profile} = \text{abs}\{FFT(T_S)\} \quad (12)$$

and $$T_S^{profile|win} = \underset{-W^- < w < W^+}{win} T_S^{profile} \quad (13)$$

where the window operation win in Equation (12) above zeros all samples in the vector other than those within the indices $-W^- < w < W^+$. The window parameters $W^-$ and $W^+$ may be selected to include all likely samples of the object within the slab without including the region outside of which the RF slab profile begins to fall off, which corresponds to about 90% of the slab width. The profile of the RF pulse may be sharpened by lengthening it from the default value, to allow a larger window for comparison. The translation estimate in the slice direction may be greatly improved if the object's profile within the window contains an edge.

In step 1210, the reference profile may be calculated as:

$$T_S^{ref|profile} = \text{abs}\{FFT(T_S^{ref})\} \quad (14)$$

If:

$$T_{S|\Delta t_S}^{profile|win|res} = \underset{\Delta t_S}{res} T_S^{profile|win} \quad (15)$$

Then in step 1215, the translation estimate $\hat{t}_S$ in the slab direction may be provided by:

$$\hat{t}_S = \underset{\Delta t_S}{\min} \left( \left| T_{S|\Delta t_S}^{profile|win|res} - T_S^{ref|profile} \right| / \left| T_S^{ref|profile} \right| \right) \quad (16)$$

This space domain technique can also be used to estimate the translations in the readout and phase encode directions, although the performance of the above-described techniques for these directions appears to be similar. In the readout direction, the translation section of the vector should be padded with zeros prior to the Fourier transformation due to the asymmetrical design of this particular section of the clover leaf. The translations can correspond to phase errors in the k-space representation of the image, and as such do not necessarily need to be corrected in real time. For example, they may be corrected by adding to every k-space sample of the image an amount given by the phase of Equation (10).

Correction of Shimming Errors

Shifts in the position of the object in the B0 field after shimming may invalidate the shim and result in offsets in the navigator trajectory in k-space and artifacts in the image. Moreover, these errors may confound the rotations and translations estimated from the navigator, and result in invalid corrections.

Linear shim errors appear in the navigator as shifts in the center of k-space that can be measured as shifts in the peaks measured during the three traversals through the center of k-space. Each shift corresponds to the projection of the X, Y and Z shim errors onto the corresponding imaging axis.

For the traversal along a given axis through the center of k-space, the echo time TE can represent the expected time from the excitation pulse to the peak. This may be obtained from the reference scan derived from the initial map. TE can represent the observed echo time. G(t) can represent the applied gradient on this axis, and ΔG may represent the gradient offset on this axis due to inaccurate shim (assumed constant for the duration of one repetition time of the sequence).

The k-space trajectory along this axis in the presence of the shim error may then be given by:

$$k'(t) = \int_0^t (G(\tau) + \Delta G) d\tau \quad (17)$$

It can be observed that:

$$k'(t_E)=0 \quad (18)$$

Therefore:

$$\int_0^{TE+\epsilon_{TE}} (G(\tau) + \Delta G) d\tau = 0 \quad (19)$$

where $\epsilon_{TE}$ is the observed shift in the peak tE−TE.

Assuming that the peak does not extend out of the constant gradient section of the navigator, i.e., assuming that:

$$G(t)=G_T \text{ for } TE<t<TE+\epsilon_{TE} \quad (20)$$

it follows that the gradient offset ΔG may be given by:

$$\Delta G=-G_T\epsilon_{TE}/(TE+2\epsilon_{TE}) \quad (21)$$

If the signal peak in the center of k-space is smooth and spherically symmetrical, the gradient offsets on the three axes may be calculated independently. In practice, this assumption and the assumptions that the peak does not extend out of the constant gradient section of the navigator and that its amplitude not decrease too much in its projection on the other axes are generally justified because the corrections on all three axes are rapidly fed back every repetition time of the sequence along with the translation and rotation corrections.

Correction of Phase Encoding Effects

If the navigator is collected after the readout, the preceding phase encoding gradients that change with every line of the image may affect the navigator. This effect becomes significant at high resolutions and small fields of view when the phase encoding gradients become large, and are due to eddy currents, e.g., linear effect, especially on the X and Y directions, and Maxwell errors, e.g., quadratic effect in the Z direction. These effects can be approximately modeled using a quadratic term added to the navigator. Accordingly, the parameters for this model can be measured during a short mapping sequence.

$M_{nav|PE}$ may be a matrix of the navigators collected during a short mapping sequence with a range of phase encoding moments listed in the vectors $a_{PE}$ and $a_{3D}$ that are a subset of the phase encoding in the imaging sequence, including the extreme values in both phase encoding directions for a 3D sequence. Then:

$$\begin{bmatrix} v \\ v_{PE} \\ v_{PE2} \\ v_{3D} \\ v_{3D2} \end{bmatrix} = B^+ M_{nav|PE} \quad (22)$$

where $$B = [1 \quad a_{PE} \quad a_{PE}^2 \quad a_{3D} \quad a_{3D}^2] \quad (23)$$

Each corrected navigator n' of the imaging sequence for phase encoding moments $a_{PE}$ and $a_{3D}$ may be obtained by modifying the acquired navigator n as follows:

$$n'=n-\alpha_{PE}v_{PE}-\alpha_{PE}^2 v_{PE}-\alpha_{3D}v_{3D}-\alpha_{3D}^2 v_{3D} \quad (24)$$

Since the Maxwell error varies with the magnitude of the gradient rather than the moment, $a_{PE}$ and $a_{3D}$ can be set to the gradient amplitude, although this would be equivalent for phase encoding pulses of fixed length. Maxwell corrections may be calculated analytically and corrected using a trimming blip on the Z gradient before the navigator, which assumes a narrow slice. As a result, trimming blips are therefore not implemented herein.

Correction of B0 Drifts

During the high resolution scanning with large gradients, heating of the shim iron can cause a drift in the B0 field. This may be equivalent to a transmit/receive frequency drift that introduces a phase roll across the sampled signal. The drifts may result in an incorrect translation estimate, even after shim correction and phase encode artifact correction are performed.

To correct for B0 drifts, N can be a complete set of N complex samples for a navigator, $N^{ref}$ may be the reference navigator from the map (or the first navigator in a scan), $T_N$ may be the time from the RF pulse to the first navigator sample, and $T_{dwell}$ can be the dwell time for navigator samples.

T can be defined as $[T_N \; T_N+T_{dwell} \ldots T_N+(N-1) \cdot T_{dwell}]$. The frequency drift Δf relative to the reference may be provided by:

$$\Delta f = \frac{1}{2\pi} \phi(N/N^{ref})T^+ \quad (25)$$

This frequency drift can be corrected for by adding the opposite phase to the navigator and image samples or by altering the frequency of the RF pulses in the sequence.

Motion Correction when Multiple Coils are Present

The corrections described above for shimming errors, phase encoding effects, and B0 drifts can be performed when, e.g., there is a single channel of data for each navigator. If a phase array is used, the data can be combined before analysis if they are weighted by the ratio of the signal detected by the body coil which generally has a uniform profile to the signal detected by each element of the array.

$N_i^{ref|PA}$, where i=1 ... M can be reference navigators collected using each of the M elements of the phase array. $N^{ref|BC}$ can be the reference navigator collected using the body coil. Then the correction vectors Wi may be given by the following scalar division:

$$W_i = \frac{\text{abs}\{N_i^{ref|PA}\}}{\text{abs}\{N^{ref|BC}\}} \quad (26)$$

The combined navigator $N^{PAcomb|abs}$ for $N^{PA}$ may then be given by:

$$N^{PAcomb|abs} = \sqrt{\sum_{i=1}^{M} W_i \cdot \{\text{abs}(N^{PA})\}^2} \quad (27)$$

This combined absolute navigator can be used for calculating the rotation estimates when multiple coils are present.

A similar correction can be performed when calculating the translation estimates. In this case, combined translation sections of the navigators may be calculated as provided above and using the correction vectors $V_i$ as follows:

$$V_i = \frac{\text{abs}\{T_i^{ref|profile|PA}\}}{\text{abs}\{T^{ref|profile|BC}\}} \quad (28)$$

These computations may be performed in the space domain. The space domain method of translation estimation may be used in this case.

Feedback Control System

A feedback control system according to an exemplary embodiment of the present invention may be used to repeatedly correct the translations and/or rotations of the gradients so that they track and possibly predict the motion of an object. Exemplary control systems may be implemented with a direct proportional feedback or with a Kalman filter with linear feedback, e.g., an LQG controller.

Figure 13:
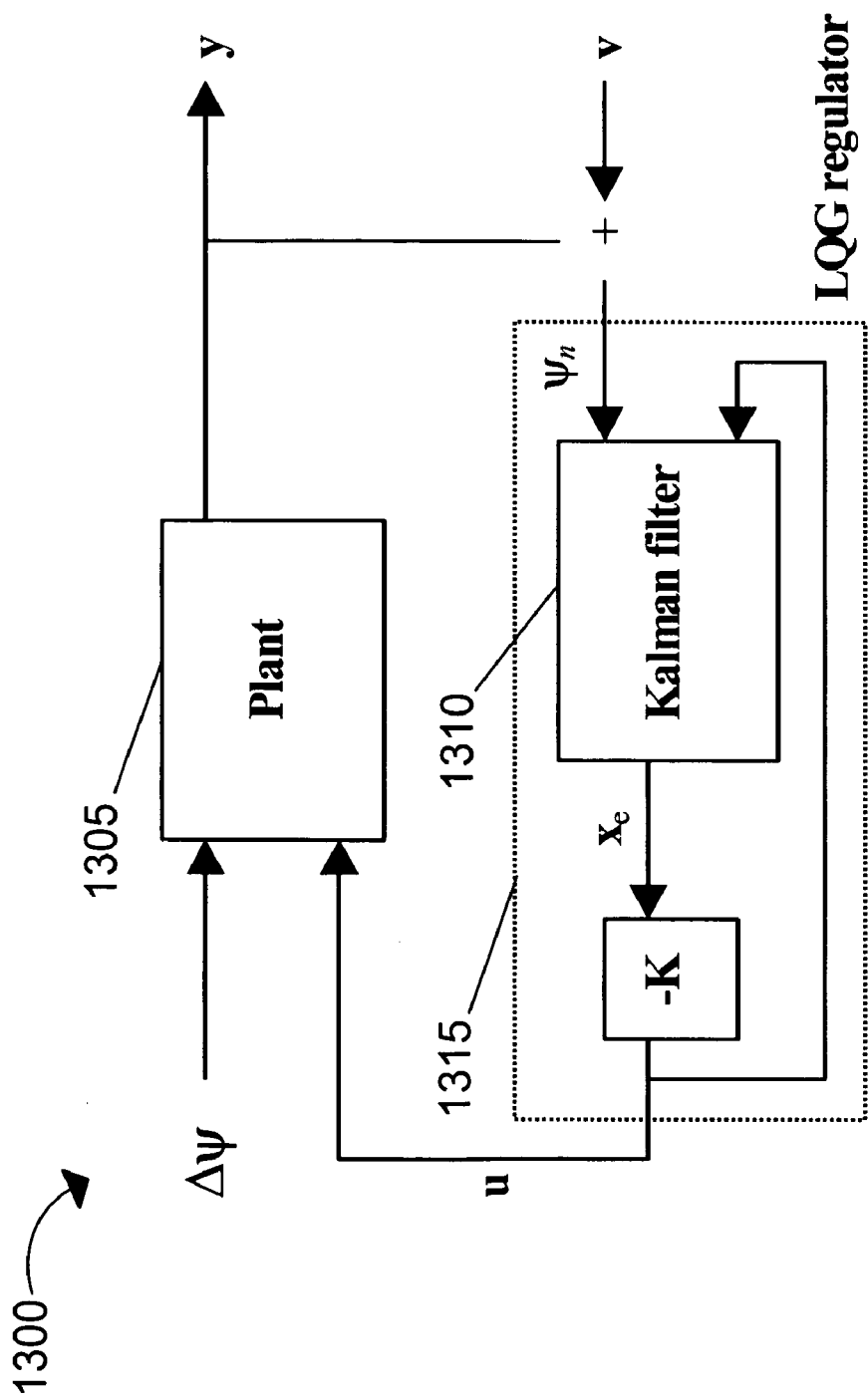
FIG. 13 shows an exemplary block diagram of a feedback control system based on a Kalman filter according to one exemplary embodiment of the present invention.

Referring to FIG. 13, an exemplary block diagram of a feedback control system based on a Kalman filter according to the present invention is provided. The feedback control system 1300 may include a plant model 1305, a Kalman filter 1310 that estimates the state of the system 1300, and an optimal state feedback mechanism 1315.

A conventional linear-quadratic-Gaussian regulator may be used to adjust the acquisition angles Λ for each estimate of the inter-navigator rotation ΔΛ of the object. Λ can represent the true absolute rotation angles of the object being scanned, and ΔΛ may represent the perturbation of the object (rotations due to subject motion) between corrections. x can be the state of the plant 1305.

The feedback control system 1300 is set up so that x can track the value of ι. The output y of the plant 1305 can be equal to the state. u can be the control signal imposed by the regulator. Then the plant 1305 may be modeled as follows:

$$x_{n+1} = x_n + u_n + \Delta\Lambda$$

$$y_n = x_n \quad (29)$$

The observed rotation angles Ψ equal the sum of the plant 1305 output and additive Gaussian measurement noise $v_n$ as follows:

$$\Psi_n = y_n + v_n \quad (30)$$

The state x of the system may be updated according to the following set of equations:

$$M_n = P_{n|n-1}(P_{n|n-1}+P)^{-1}$$

$$\hat{x}_{n|n} = \hat{x}_{n|n-1} + M_n(\Psi_n - \hat{x}_{n|n-1})$$

$$P_{n|n-1} = (I - M_n)P_{n|n} \quad (31)$$

The state prediction for the next time step may then be calculated as follows:

$$\hat{x}_{n+1|n} = \hat{x}_{n|n} + u_n \quad (32)$$

$$P_{n+1|n} = P_{n|n} + Q \quad (33)$$

where Q is the perturbation covariance and R is the measurement noise covariance. P is the error covariance that may be updated at each time interval, with an initial value of Q.

The control signal u may then be calculated from the state estimate $\hat{x}$ as follows:

$$u_{n+1} = -K\hat{x}_{n+1|n} \quad (34)$$

where K is the linear-quadratic (LQ) optimal gain, chosen to minimize the following performance criterion:

$$J(u) = \int_0^\infty \{x^T Q x + 2 x^T N u + u^T R u\} dt \quad (35)$$

In addition, estimated linear shim terms and frequency drift may be included in the observed parameters of the control system. In addition, the linear offsets on the gradient amplifiers and the RF frequency offset may be included as controlled parameters in the control system. In this manner, motion, shim and RF offset can be controlled together in an optimal manner.

Motion Correction Example

Figure 14:
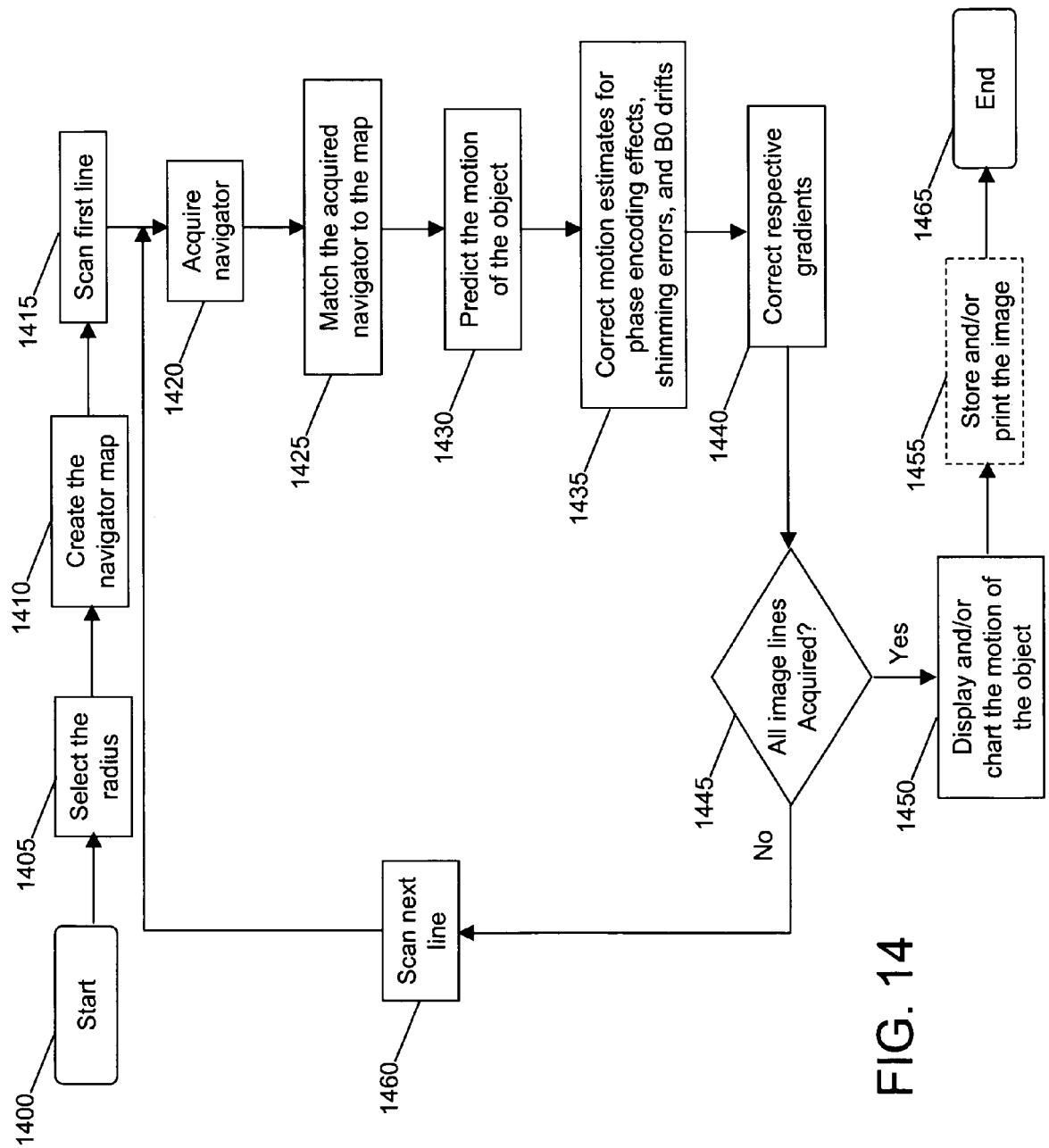
FIG. 14 shows a flow diagram of an exemplary embodiment of the method according to the present invention for tracking and correcting a motion of an anatomical object in real time.

Referring to FIG. 14, a flow diagram of an exemplary embodiment of the method according to the present invention for tracking and correcting a motion of an anatomical object in real time is provided. In particular, the optimal radius for the clover leaf navigator is selected in step 1405. A method for selecting the optimal radius is described in further detail in U.S. patent application Ser. No. 10/846,372, the entire disclosure of which is incorporated herein by reference.

Then, in step 1410, the navigator map is created. The navigator for the selected scanned line is acquired (step 1420), and this navigator is matched and/or compared to the data of the acquired map (step 1425). Thereafter, in step 1430, the motion of the object can be predicted, and in step 1435, the motion estimates are corrected for phase encoding effects, shimming errors, and B0 drifts as described in detail herein above.

In step 1440, the respective gradients are corrected using the predicted motion of the object and the results of the calculation of steps 1430-1435. Furthermore, certain models (e.g., an ARMA model) can be used to forecast the position of the object so that further motion between the time of the navigator and the subsequent correction of the gradients can be accounted for, even if the motion is oscillatory. A feedback may also be achieved using a feedback control system with a state estimator such as the linear-quadratic-Gaussian controller with the state estimated by a Kalman filter shown in FIG. 13.

In step 1445, it can be determined whether all image lines were scanned or obtained. If not, the next line is scanned or obtained (step 1460), and the process is returned to step 1420 to initiate the calculations for the navigator associated with the next line. Otherwise, in step 1450, the image and/or data corresponding to the motion of the object can be displayed on the display device 120 (see FIG. 1). In addition, the image may be stored in the database 125 and/or printed by the printer 130 (step 1455). Furthermore, the motion data (e.g., the rotations and/or translations) may be displayed, stored or printed.

Experimental Results

Testing the motion correction using navigators may be performed with or without a human model.

For example, testing the motion correction using navigators without a human model generally uses an appropriate testing phantom. A typical water-filled phantom is inappropriate for testing the navigators because it has insufficient structure in k-space along the path of the navigator to provide a unique match to the map and because rotations of phantoms containing liquid are not rigid. It is desirable that the phantom be calibrated in some way so that the exact motion can be determined, i.e. the phantom should have an attached graduated ruler and protractor.

One possibility is to use a pineapple as a phantom. The pineapple has sufficient internal structure, appropriate contrast and is sufficiently rigid to act as a good model of a human head for the purposes of testing navigators. The pineapple's radial symmetry does not generally present a problem.

Another alternative is to use a number of, e.g., bananas as a phantom, with the bunch bound together to prevent non-rigid displacement, since the bunch has no axis of symmetry.

A motion-stimulating platform for testing motion correction with the pineapple as a phantom may be build out of a plastic frame with distance and angle markings and a lever arm so that an attached object, e.g., the pineapple, can be easily manipulated outside the scanner bore.

Figure 15:
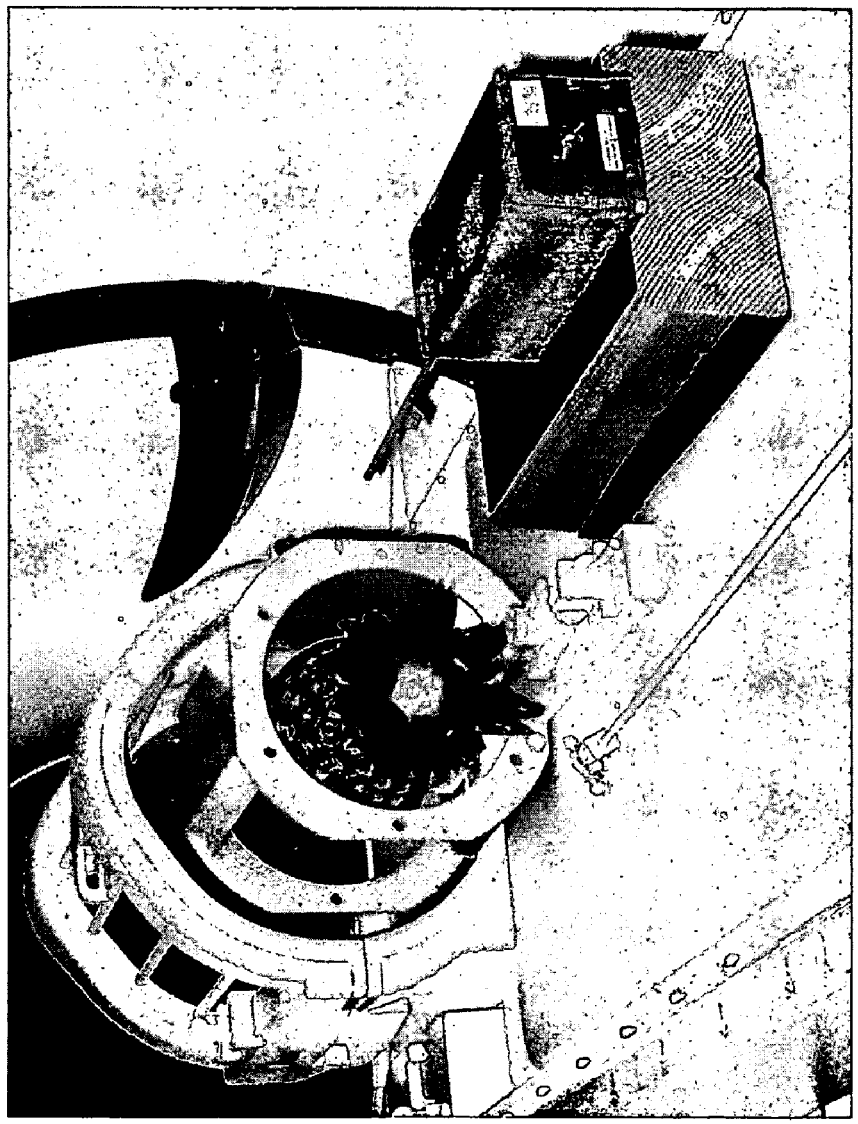
FIG. 15 shows an exemplary platform and arrangement for simulating motion which can be used for the exemplary embodiments of the present invention.

FIG. 15 shows an exemplary platform and arrangement 1800 for simulating motion which can be used for the exemplary embodiments of the present invention. For example, the apparatus 1800 can include a motor (provided as a copper enclosure) which can connect to the platform via the white fiberglass rod to keep it away from the magnet bore. The phantom (e.g., pineapple) can be strapped to the platform, which oscillates a few degrees in each direction around the Y axis of the scanner.

Figure 16:
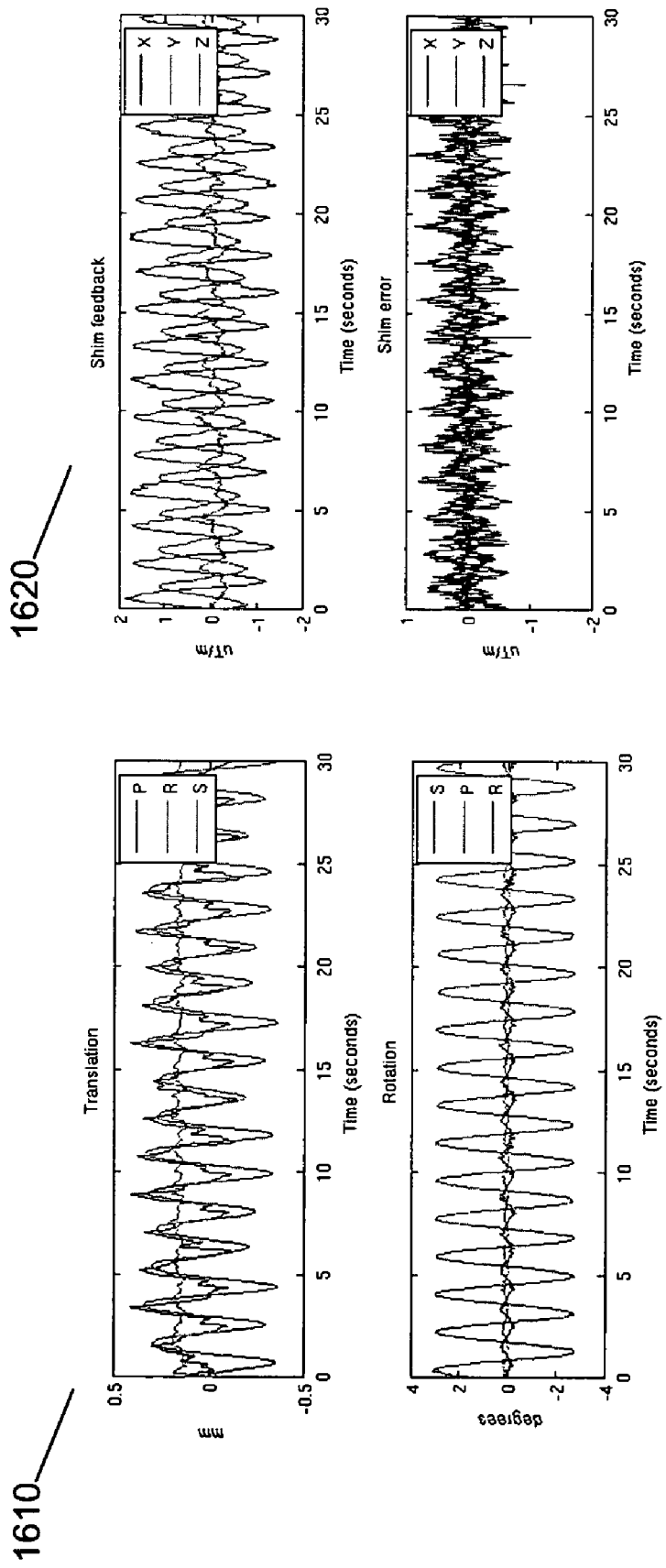
FIG. 16 shows exemplary graphs of log of estimated and corrected motion.
Figure 17A:
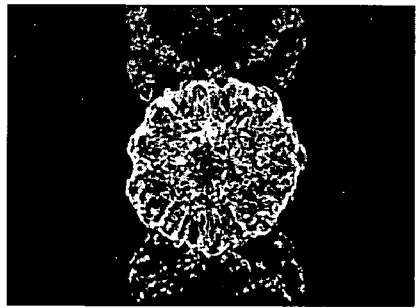
FIGS. 17A and 17B show axial sections of images that illustrate motion with no correction, and motion with constrained and shim correction, respectively, according to the present invention.
Figure 17B:
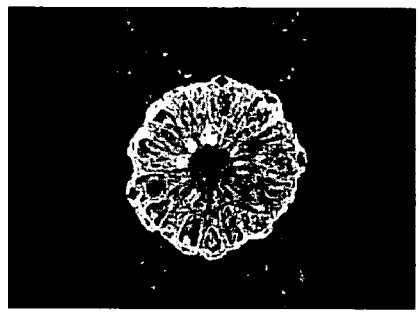
Figure 18A:
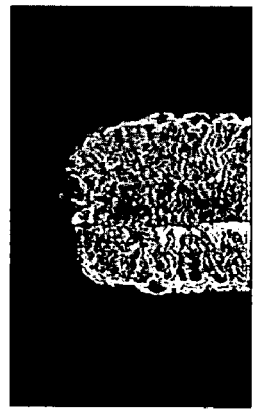
FIGS. 18A and 18B show sagittal sections of images that illustrate motion with no correction, and motion with constrained and shim correction, respectively, according to the present invention.
Figure 18B:
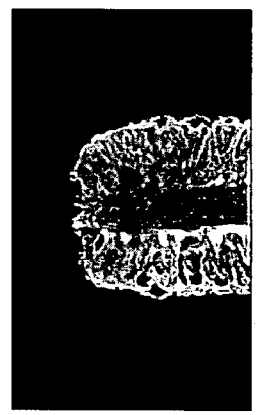
Figure 19A:
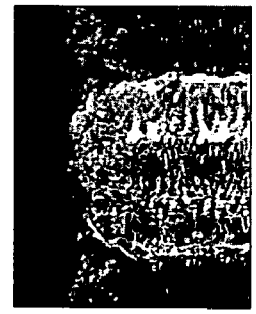
FIGS. 19A and 19B show coronal sections of images that illustrate motion with no correction, and motion with constrained and shim correction, respectively, according to the present invention.
Figure 19B:
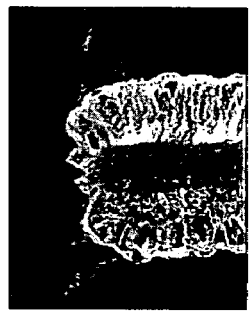

FIG. 16 shows exemplary graphs of log of estimated and corrected motion during a predetermined time period (e.g., first 30 seconds) of FLASH scan of pineapple 1610 and log of shim corrections 1620.

On a Siemens (Erlangen, Germany) Avanto 1.5T scanner, using a single channel birdcage coil, we collected a map with the pineapple on the stationary platform, a reference scan with no motion and no motion correction and another reference scan with no motion and motion correction using the constrained algorithm for rotation estimates and shim correction. We then activated the platform to rotate back and forth about the axis that would be anterior-posterior for a supine subject (Y axis of scanner) through a total angle of about 5.5 deg. continuously with a period of around 1 s. We collected five additional scans while the phantom was moving. During the first scan, motion correction was disabled. During the remaining four scans, we activated real-time motion correction using the quick linear and the constrained rotation algorithms, each with and without real-time shim correction. In all cases, the phase slope method was used to estimate translations in the phase and frequency encoding directions and the projection method was used to estimate translation in the through-plane (slice encoding) direction. The estimated motion and shim parameters for one of these scans (results for the other scans were similar) are shown in FIG. 16.

FIGS. 17A-17B, 18A-18B and 19A-19B show representative axial, sagittal and coronal slices of the resulting images with (FIGS. 17A, 18A, 19A) and without (FIGS. 17B, 18B, 19B) motion correction. Images were collected on a 1.5T Siemens Avanto using the 3D FLASH sequence with cloverleaf navigators, matrix 256×192 (75% rectangular field of view), phase encoding left to right, 112 partitions (with 16 additional oversampled partitions), field of view 256 mm, slab thickness 150 mm, resolution 1.0×1.0×1.33 m, TR=20 ms, TE=3.2 ms, BW=695 Hz/pixel, navigator amplitude 0.125 mm$^{-1}$, navigator after readout with time between RF and start of navigator=5.45 ms, feedback gain 0.4, shim feedback gain 0.1, Tacq=8:16. The periodic nature of the motion results in a few dominant ghosts compared to the human results in which the ghosts are randomly distributed in the phase encoding direction.

To quantify the results, we constructed a mask matching the region of the volume occupied by the phantom in the reference scan (no motion, but motion corrected) and considered this to be the region of signal. The background can be considered to be noise. Signal-to-Noise ("SNR") can be determined as the mean signal in the masked region divided by the standard deviation of the background noise. Calculations can be made for the scans with motion the standard deviation of the difference in signal between each scan and the reference and the standard deviation of the noise.

Table 1 summarizes these results.

TABLE 1

Results of navigator tests with pineapple phantom.

| Description of volume | | | Std. dev. | Std. dev. |
|---|---|---|---|---|
| Motion | Correction | SNR | (error) | (noise) |
| No | Constr. + shim | 15.67 | (reference) | (reference) |
| No | None | 15.96 | 16.40 | 8.89 |
| Yes | None | 5.83 | 73.07 | 28.37 |
| Yes | Constr. | 10.09 | 29.33 | 16.15 |
| Yes | Constr. + shim | 10.73 | 25.54 | 15.09 |
| Yes | Quick | 9.62 | 32.15 | 16.55 |
| Yes | Quick + shim | 9.73 | 33.60 | 16.22 |

The exemplary embodiments of the present invention described herein above have been tested on two human subjects. Testing the motion correction using navigators with human subjects was performed by scanning two subjects and collecting six high resolution FLASH scans for each subject. During all six scans, the subjects performed deliberate and random head motions at regular intervals. Three of the scans were performed with the motion correction on and three with motion correction off. The order of scans was randomized, and the subjects were not informed of the scan order.

Figure 20C:
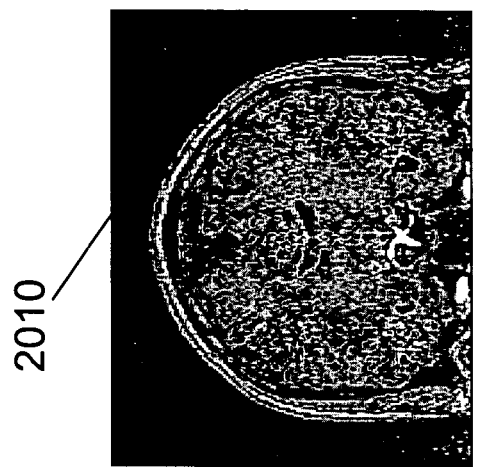
FIGS. 20A-20C show exemplary images acquired for a subject with motion correction techniques performed according to the present invention.
Figure 20B:
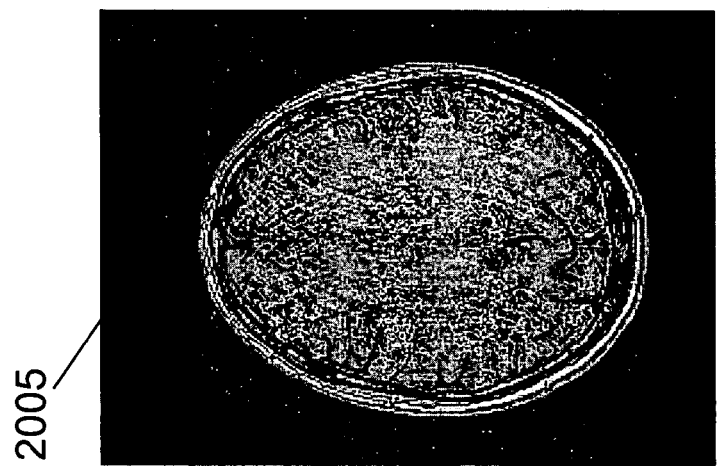
Figure 20A:
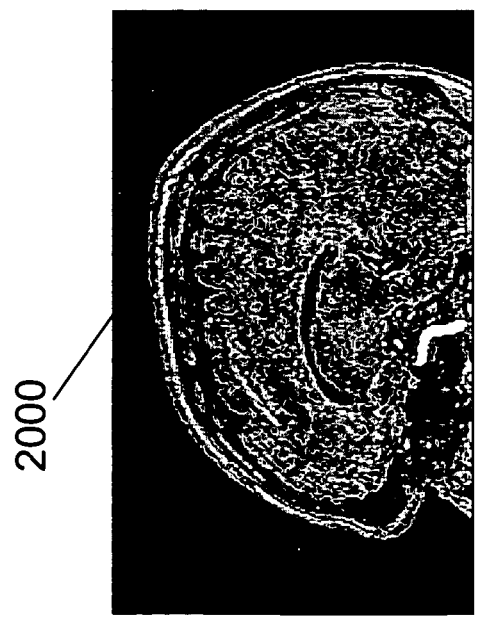

FIGS. 20A-C show images of the results for a single scan of a subject with motion correction. With the assistance of a motion corrected sequence according to the principles and exemplary embodiments of the present invention described herein above, high resolution FLASH scans 2000, 2005, and 2010 were collected for TR=20 ms, 1.3×1×1.3 mm, and Tacq=7:45.

The high-resolution scans 2000-2010 indicate that the motion correction as described herein above may significantly improve imaging in otherwise troublesome populations. Furthermore, with the entire procedure including image map analysis and image reconstruction integrated with the scanner, the motion correction may be easily performed by an MRI operator to significantly improve image quality for a multitude of scans.

The foregoing descriptions of specific embodiments and best mode of the present invention have been presented for purposes of illustration and description only. They are not intended to be exhaustive or to limit the invention to the precise forms disclosed. Specific features of the invention are shown in some drawings and not in others, for purposes of convenience only, and any feature may be combined with other features in accordance with the invention. Steps of the described processes may be reordered or combined, and other steps may be included. The embodiments were chosen and described in order to best explain the principles of the invention and its practical application, to thereby enable others skilled in the art to best utilize the invention and various embodiments with various modifications as are suited to the particular use contemplated. Further variations of the invention will be apparent to one skilled in the art in light of this disclosure and such variations are intended to fall within the scope of the appended claims and their equivalents. The publications referenced above are incorporated herein by reference in their entireties.

What is claimed is:

1. A method of correcting or compensating for a motion of an object during a magnetic resonating imaging ("MRI") scan of the object, comprising the steps of:
    obtaining first data for the object, the first data including data defining a navigator and a path of the navigator;
    obtaining second data for the object, the second data defining a map of the object;
    determining whether at least one of a correction or a compensation of at least one of a translation or a rotation is to take place, wherein the correction or the compensation is performed based on the first data, the second data and deviations of at least one of the first data or the second data.

2. The method according to claim 1, wherein the determining step includes comparing the first data with the second data to obtain comparison data.

3. The method according to claim 2, wherein the determining step is performed repeatedly in real time.

4. The method according to claim 3, wherein the path of the navigator comprises a first segment and a second segment, the first segment comprising straight traversals through a center of a k-space region corresponding to positional data for the object, and the second segment comprising arcs in at least one perpendicular plane with respect to the k-space region.

5. The method according to claim 1, wherein the navigator includes a plurality of gradients.

6. The method according to claim 1, wherein the path of the navigator is defined by the first data is a three-dimensional structure representation.

7. The method according to claim 6, wherein the structure is provided in a k-space region, and wherein the k-space region is spherical.

8. The method according to claim 7, wherein the path of the navigator is defined by the first data lies substantially outside the k-space region.

9. The method according to claim 8, wherein the path of the navigator is defined by the first data lies substantially within the k-space region.

10. The method according to claim 1, wherein the second data is obtained as a function of the first data.

11. The method according to claim 1, wherein the rotation of the object is described using quaternions.

12. The method according to claim 2, wherein the determining step further comprises the substep of modifying the second data as a function of the comparison data.

13. The method according to claim 12, wherein the determining step further comprises the substep of modifying the second data as a function of the comparison data.

14. The method according to claim 1, further comprising the step of repeatedly modifying at least one of the translation or the rotation of the object using a feedback control system.

15. The method according to claim 1, wherein the deviations of at least one of the first data or the second data comprise deviations of at least one of a phase encoding gradient, a position of the object in a B0 field after shimming, or a drift in the B0 field.

16. The method according to claim 1, wherein the determining step further comprises correcting or compensating for at least one of the translation or the rotation of the object when multiple coils are used during the MRI scan.

17. The method according to claim 1, wherein the determining step comprises estimating and removing out-of-plane effects from the navigator.

18. The method according to claim 1, wherein the object is an anatomical structure.

19. A system for correcting for a motion of an object during an MRI scan of the object, comprising:
    a processor configured to:
        obtain first data for the object, the first data defining a navigator and a path of the navigator;
        obtain second data for the object, the second data defining a map of the object; and
        determine whether at least one of a correction or a compensation of at least one of a translation or a rotation is to take place, wherein the correction or the compensation is performed based on the first data, the second data, and deviations of at least one of the first data or the second data.

20. The system of claim 19, wherein the deviations of at least one of the first data or the second data comprise deviations of at least one of a phase encoding gradient, a position of the object in a B0 field after shimming, or a drift in the B0 field.

21. The system of claim 19, wherein the processor is further configured to repeatedly modify at least one of the translation or the rotation of the object using a feedback control system.

22. A software arrangement provided for correcting a motion of an object during an MRI scan of the object, comprising:
    a first module programmed to obtain first data for the object, the first data defining a navigator and a path of the navigator;
    a second module programmed to obtain second data for the object, the second data defining a map of the object; and
    a third module programmed to determine whether at least one of a correction or a compensation of at least one of a translation or a rotation is to take place, wherein the correction or the compensation is performed based on the first data, the second data, and deviations of at least one of the first data or the second data.

23. The software arrangement of claim 22, wherein the deviations of at least one of the first data or the second data comprise deviations of at least one of a phase encoding gradient, a position of the object in a B0 field after shimming, or a drift in the B0 field.

24. The software arrangement of claim 22, further comprising a fourth module programmed to repeatedly correct at least one of the translation or the rotation using a feedback control system.

25. A computer-accessible medium which includes and facilitates an execution of a set of instructions that are provided for correcting a motion of an object during an MRI scan of the object, wherein, when a processing arrangement executes the instructions, the processing arrangement executes the steps comprising:
   obtaining first data for the object, the first data defining a navigator and a path of the navigator;
   obtaining second data for the object, the second data defining a map of the object; and
   determining whether at least one of a correction or a compensation of at least one of a translation or a rotation is to take place, wherein the correction or the compensation is performed based on the first data, the second data, and deviations of at least one of the first data or the second data.

26. The computer-accessible medium of claim 25, wherein the deviations of at least one of the first data or the second data comprise deviations of at least one of a phase encoding gradient, a position of the object in a B0 field after shimming, or a drift in the B0 field.

27. The computer-accessible medium of claim 25, wherein the processing arrangement repeatedly corrects at least one of the translation or the rotation using a feedback control system.

28. A method of obtaining information during a magnetic resonating imaging ("MRI") scan of at least one portion of an object, comprising the steps of:
   obtaining first data for the object, the first data including data defining a navigator and a path of the navigator;
   obtaining second data for the object, the second data defining a map of the object;
   determining whether at least one of a correction or a compensation of at least one of a shim, B0 drift, a combination of rotation, translation shim and drift associated with the object, wherein the correction or compensation is performed based on the first data, the second data and deviations of at least one of the first data or the second data.

29. A software arrangement provided for obtaining information for an object during an MRI scan of the object, comprising:
   a first module programmed to obtain first data for the object, the first data including data defining a navigator and a path of the navigator;
   a second module programmed to obtain second data for the object, the second data defining a map of the object;
   a third module programmed to determine whether at least one of a correction or a compensation of at least one of a shim, B0 drift, a combination of rotation, translation shim and drift associated with the object, wherein the at least one of the correction or the compensation is performed based on the first data, the second data and deviations of at least one of the first data or the second data.

30. A system for obtaining information for an object during an MRI scan of the object, comprising:
   a processor configured to:
      obtain first data for the object, the first data including data defining a navigator and a path of the navigator;
      obtain second data for the object, the second data defining a map of the object;
      determine whether at least one of a correction or a compensation of at least one of a shim, B0 drift, a combination of rotation, translation shim and drift associated with the object, wherein the at least one of the correction or the compensation is performed based on the first data, the second data and deviations of at least one of the first data or the second data.

31. A computer-accessible medium which includes and facilitates an execution of a set of instructions that are provided for obtaining information during a magnetic resonating imaging ("MRI") scan of at least one portion of an object, wherein when a processing arrangement executes the instructions, the processing arrangement executes the steps comprising:
   obtaining first data for the object, the first data including data defining a navigator and a path of the navigator;
   obtaining second data for the object, the second data defining a map of the object;
   determining whether at least one of a correction or a compensation of at least one of a shim, B0 drift, a combination of rotation, translation shim and drift associated with the object, wherein the at least one of the correction or the compensation is performed based on the first data, the second data and deviations of at least one of the first data or the second data.

32. A method for producing an image of an object with a magnetic resonance imaging (MRI) system, comprising:
   a) acquiring a map of the object by repeatedly performing a navigator pulse sequence with the MRI system to obtain a plurality of navigator signals and in which each navigator signal samples k-space along a navigator path oriented at a different angle;
   b) acquiring a k-space image data set by performing a scan of the object by repeatedly performing an imaging pulse sequence with the MRI system;
   c) acquiring navigator k-space data with the MRI system during the performance of the scan in step b) by interleaving the performance of the navigator pulse sequence with the performance of the imaging pulse sequence;
   d) altering the k-space image data acquired in step b) by comparing the acquired navigator k-space data with the acquired map to determine the alteration; and
   e) reconstructing an image with the k-space image data altered in step d).

33. The method of claim 32, wherein the k-space navigator path includes:
   three orthogonal straight line segments that pass through the center of k-space, and
   three orthogonal 90° arcuate segments.

34. The method of claim 32, wherein the k-space is altered in step d) after the k-space image data is acquired.

35. The method of claim 32, wherein the k-space is altered in step d) by altering the imaging pulse sequence used to acquire the k-space image data.

36. The method of claim 32, wherein the comparison in step d) comprises substeps of:
   i) determining the translation of the object along the axes defined by each of the three orthogonal straight line segments, and
   ii) determining the rotation of the object about the axes defined by each of the three orthogonal arcuate segments.

37. The method of claim 36, wherein the translation and the rotation are determined by matching the acquired k-space navigator data with the navigator signals in the acquired map.

38. The method of claim 32, further comprising:
(f) combining the imaging pulse sequence used in step b) and the navigator pulse sequence used in step c) into a single pulse sequence by:
i) producing an radio frequency (RF) excitation pulse,
ii) performing an image data readout kernel in which prescribed imaging gradients are produced and the k-space image data are acquired, and
iii) performing a navigator data readout kernel in which k-space navigator data along the k-space navigator path are acquired.

39. The method of claim 38, wherein the k-space navigator path includes:
i) three orthogonal straight line segments that pass through the center of k-space, and
ii) three orthogonal 90°arcuate segments.

40. The method of claim 38, wherein the alterations in step d) are made by altering the image data readout kernel.

41. The method of claim 38, wherein the image data readout kernel precedes the navigator data readout kernel and further comprising:
(g) altering the navigator data readout kernel as a function of the magnitude of a phase encoding gradient produced during the image data readout kernel.

42. The method of claim 41, wherein step a) includes acquiring additional map data over a range of phase encoding gradient magnitudes, and wherein step f) includes calculating the alteration of the navigator data readout kernel using the additional map data.

43. The method of claim 32, further comprising detecting changes in a polarizing magnetic field $B_0$ during the scan, and altering the navigator pulse sequence to offset effects attributable to the changes.

44. The method of claim 43, wherein the changes in the polarizing magnetic field $B_0$ include changes in a shim caused by a motion of the object.

45. The method of claim 43, wherein the changes in the polarizing magnetic field $B_0$ include changes in a magnitude of the magnetic field caused by a drift.

46. The method of claim 43, wherein the changes are detected by comparing k-space navigator data with the map acquired in step a).

47. The method of claim 32, wherein the MRI system includes a plurality of receive coils, and wherein the signals produced by the receive coils during the performance of the navigator pulse sequence are combined to form the acquired navigator signal that samples k-space along a path of the navigator.

48. The method of claim 47, wherein the receive coil signals are combined in a first configuration to provide a first acquired navigator signal that is used in step d) to determine a translation of the object, and wherein the receive coil signals are combined in a second configuration to provide a second acquired navigator signal that is used in step d) to determine a rotation of the object.

49. A software arrangement provided for producing an image of an object with a magnetic resonance imaging (MRI) system, comprising:
a first module programmed to acquire a map of the object by repeatedly performing a navigator pulse sequence with the MRI system to obtain a plurality of navigator signals and in which each navigator signal samples k-space along a navigator path oriented at a different angle;
a second module programmed to acquire a k-space image data set by performing a scan of the object by repeatedly performing an imaging pulse sequence with the MRI system;
a third module programmed to acquire navigator k-space data with the MRI system during the performance of the scan using the second module by interleaving the performance of the navigator pulse sequence with the performance of the imaging pulse sequence;
a fourth module programmed to alter the k-space image data acquired using the second module by comparing the acquired navigator k-space data with the acquired map to determine the alteration; and
a fifth module programmed to reconstruct an image with the k-space image data altered using the fourth module.

50. A system for producing an image of an object with a magnetic resonance imaging (MRI) system, comprising:
a processor configured to:
(a) acquire a map of the object by repeatedly performing a navigator pulse sequence with the MRI system to obtain a plurality of navigator signals and in which each navigator signal samples k-space along a navigator path oriented at a different angle;
(b) acquire a k-space image data set by performing a scan of the object by repeatedly performing an imaging pulse sequence with the MRI system;
(c) acquire navigator k-space data with the MRI system during the performance of the scan in procedure b) by interleaving the performance of the navigator pulse sequence with the performance of the imaging pulse sequence;
(d) alter the k-space image data acquired in procedure b) by comparing the acquired navigator k-space data with the acquired map to determine the alteration; and
(e) reconstruct an image with the k-space image data altered in procedure d).

51. A computer-accessible medium which includes and facilitates an execution of a set of instructions that are provided for producing an image of an object with a magnetic resonance imaging (MRI) system, wherein when a processing arrangement executes the instructions, the processing arrangement executes the steps comprising:
a) acquiring a map of the object by repeatedly performing a navigator pulse sequence with the MRI system to obtain a plurality of navigator signals and in which each navigator signal samples k-space along a navigator path oriented at a different angle;
b) acquiring a k-space image data set by performing a scan of the object by repeatedly performing an imaging pulse sequence with the MRI system;
c) acquiring navigator k-space data with the MRI system during the performance of the scan in step b) by interleaving the performance of the navigator pulse sequence with the performance of the imaging pulse sequence;
d) altering the k-space image data acquired in step b) by comparing the acquired navigator k-space data with the acquired map to determine the alteration; and
e) reconstructing an image with the k-space image data altered in step d).

* * * * *